US012588195B2

(12) United States Patent
Lee

(10) Patent No.: US 12,588,195 B2
(45) Date of Patent: Mar. 24, 2026

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 17/353,408

(22) Filed: Jun. 21, 2021

(65) Prior Publication Data

US 2022/0189980 A1     Jun. 16, 2022

(30) Foreign Application Priority Data

Dec. 10, 2020    (KR) ........................ 10-2020-0172729

(51) Int. Cl.
| | |
|---|---|
| *H10B 41/20* | (2023.01) |
| *H01L 23/528* | (2006.01) |
| *H10B 41/10* | (2023.01) |
| *H10B 43/10* | (2023.01) |
| *H10B 43/20* | (2023.01) |

(52) U.S. Cl.
CPC ......... *H10B 41/20* (2023.02); *H01L 23/5283* (2013.01); *H10B 41/10* (2023.02); *H10B 43/10* (2023.02); *H10B 43/20* (2023.02)

(58) Field of Classification Search
None
See application file for complete search history.

(56) References Cited

U.S. PATENT DOCUMENTS

| | | | |
|---|---|---|---|
| 10,553,599 B1 | 2/2020 | Chen et al. | |
| 10,629,611 B2 | 4/2020 | Cui et al. | |
| 10,916,556 B1* | 2/2021 | Sakakibara | H10B 41/27 |
| 2003/0006439 A1* | 1/2003 | Bailey | H10B 53/30 |
| | | | 257/295 |
| 2011/0298037 A1* | 12/2011 | Choe | G11C 16/0483 |
| | | | 257/314 |
| 2014/0070300 A1* | 3/2014 | Jang | H01L 29/66833 |
| | | | 257/324 |
| 2014/0246646 A1* | 9/2014 | Sasago | H10B 63/34 |
| | | | 438/238 |
| 2019/0043830 A1* | 2/2019 | Sakakibara | H10B 43/27 |
| 2019/0267391 A1 | 8/2019 | Imai et al. | |
| 2019/0326313 A1* | 10/2019 | Cui | H10B 41/27 |
| 2019/0326315 A1* | 10/2019 | Lee | H10B 43/30 |
| 2021/0091093 A1* | 3/2021 | Kanamori | H10B 43/35 |

FOREIGN PATENT DOCUMENTS

| | | |
|---|---|---|
| CN | 111211132 A | 5/2020 |
| CN | 111681988 A | 9/2020 |
| JP | 2020150037 A | 9/2020 |
| KR | 1020140035084 A | 3/2014 |

* cited by examiner

*Primary Examiner* — Jessica S Manno
*Assistant Examiner* — Christopher A. Schodde
(74) *Attorney, Agent, or Firm* — WILLIAM PARK AND ASSOCIATES LTD.

(57) ABSTRACT

A semiconductor device includes: conductive layers and interlayer insulating layers, which are alternately stacked; a select conductor spaced apart from the conductive layers; cell plugs penetrating the conductive layers, the interlayer insulating layers, and the select conductor; and an auxiliary conductor in contact with the select conductor.

21 Claims, 34 Drawing Sheets

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0172729 filed on Dec. 10, 2020, in the Korean Intellectual Property Office, the entire disclosure of which is incorporated by reference herein.

BACKGROUND

1. Technical Field

The present disclosure may generally relate to a semiconductor device and a manufacturing method of a semiconductor device, and more particularly, to a three-dimensional semiconductor device and a manufacturing method of a three-dimensional semiconductor device.

2. Related Art

A semiconductor device includes memory cells capable of storing data. A three-dimensional semiconductor device includes three-dimensionally arranged memory cells, so that an area occupied by memory cells per unit area of a substrate can be reduced.

In order to improve the degree of integration of the three-dimensional semiconductor device, a stacked number of memory cells may be increased. The operational reliability of the three-dimensional semiconductor device may be deteriorated as the stacked number of memory cells is increased.

SUMMARY

In an embodiment of the present disclosure, there may be provided a semiconductor device including: conductive layers and interlayer insulating layers, which are alternately stacked; a select conductor spaced apart from the conductive layers; outer cell plugs penetrating the conductive layers, the interlayer insulating layers, and the select conductor; and an outer auxiliary conductor surrounding the outer cell plugs, the outer auxiliary conductor being in contact with the select conductor, wherein the outer auxiliary conductor includes round parts and connection parts, wherein the round parts respectively surround the outer cell plugs, and wherein the connection parts connect the round parts adjacent to each other.

In an embodiment of the present disclosure, there may be provided a semiconductor device including: conductive layers and interlayer insulating layers, which are alternately stacked; a select conductor spaced apart from the conductive layers; inner cell plugs penetrating the conductive layers, the interlayer insulating layers, and the select conductor; and inner auxiliary conductors in contact with the select conductor, and wherein the inner auxiliary conductors respectively surround the inner cell plugs, and wherein the inner auxiliary conductors are disposed at a level higher than that of the select conductor.

In an embodiment of the present disclosure, there may be provided a semiconductor device including: conductive layers and interlayer insulating layers, which are alternately stacked; a select conductor spaced part from the conductive layers; and cell plugs penetrating the conductive layers, the interlayer insulating layers, and the select conductor, wherein the select conductor includes a select base part surrounding the cell plugs and select protrusion parts protruding in a length direction of the cell plugs from the select base part.

In an embodiment of the present disclosure, there may be provided a method of manufacturing a semiconductor device, the method including: forming a select conductive layer on a substrate; forming a stack structure on the select conductive layer; forming cell plugs penetrating the select conductive layer and the stack structure; exposing the cell plugs and the select conductive layer by removing the substrate; isolating the select conductive layer into select conductors; forming an auxiliary conductive layer covering the select conductors; and etching the auxiliary conductive layer.

In an embodiment of the present disclosure, there may be provided a method of manufacturing a semiconductor device, the method including: forming an interlayer sacrificial layer on a substrate; forming a select sacrificial layer on the interlayer sacrificial layer; forming a preliminary stack structure on the select sacrificial layer; forming cell plugs penetrating the preliminary stack structure, the select sacrificial layer, and the interlayer sacrificial layer; removing the select sacrificial layer; forming a select conductive layer in a region in which the select sacrificial layer is removed; exposing the cell plugs and the select conductive layer by removing the substrate and the interlayer sacrificial layer; forming a select conductor surrounding the cell plugs by etching the select conductive layer; forming an auxiliary conductive layer in contact with the select conductor; and etching the auxiliary conductive layer.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2, 3, 4, 5, 6, 7, 8A, 9, 10, 11, and 12 are sectional views illustrating a manufacturing method of the semiconductor device in accordance with an embodiment of the present disclosure.

FIGS. 14, 15, 16, 17, 18, and 19 are sectional views illustrating a manufacturing method of the semiconductor device in accordance with an embodiment of the present disclosure.

FIGS. 20A and 20B are sectional views illustrating a semiconductor device in accordance with an embodiment of the present disclosure.

FIGS. 21, 22, 23, and 24 are sectional views illustrating a manufacturing method of the semiconductor device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device having improved operational reliability.

Figure 1A:
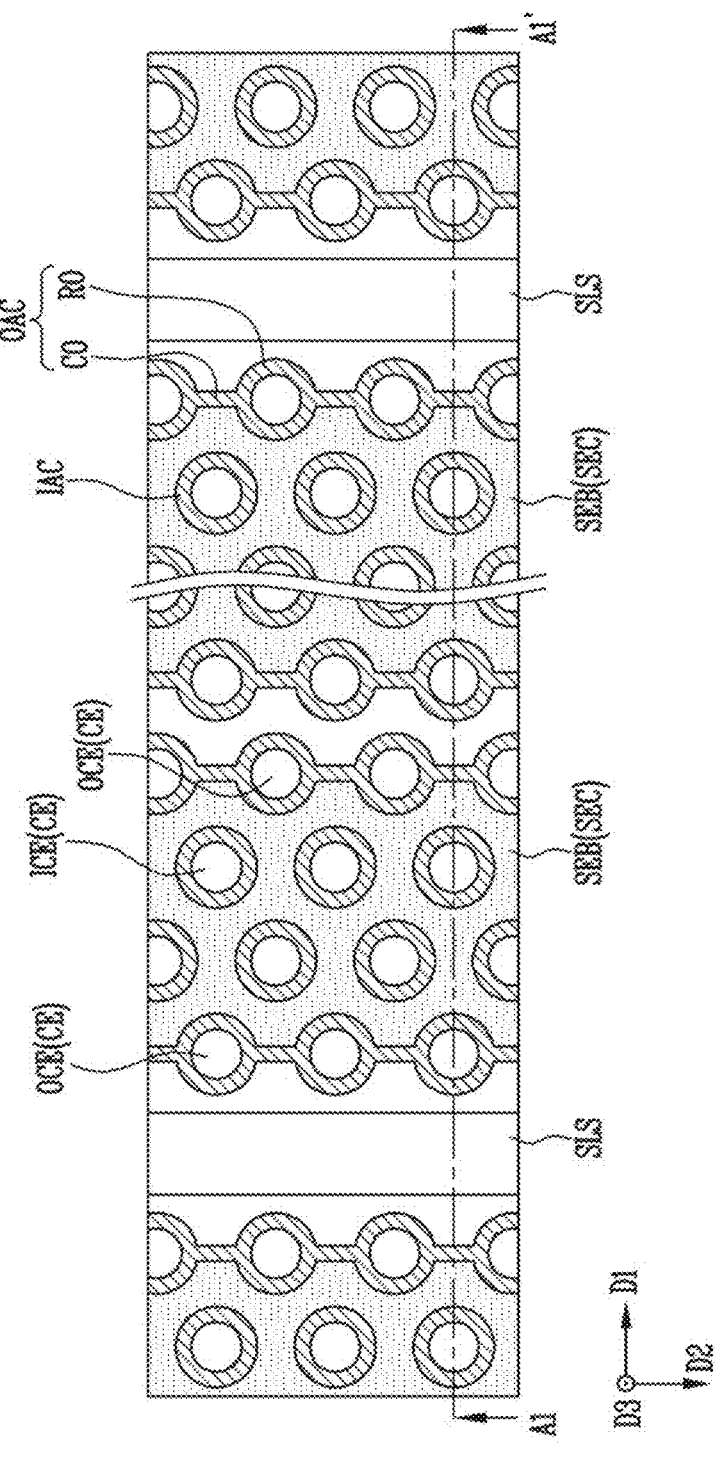
FIG. 1A is a plan view of a semiconductor device in accordance with an embodiment of the present disclosure.
Figure 1B:
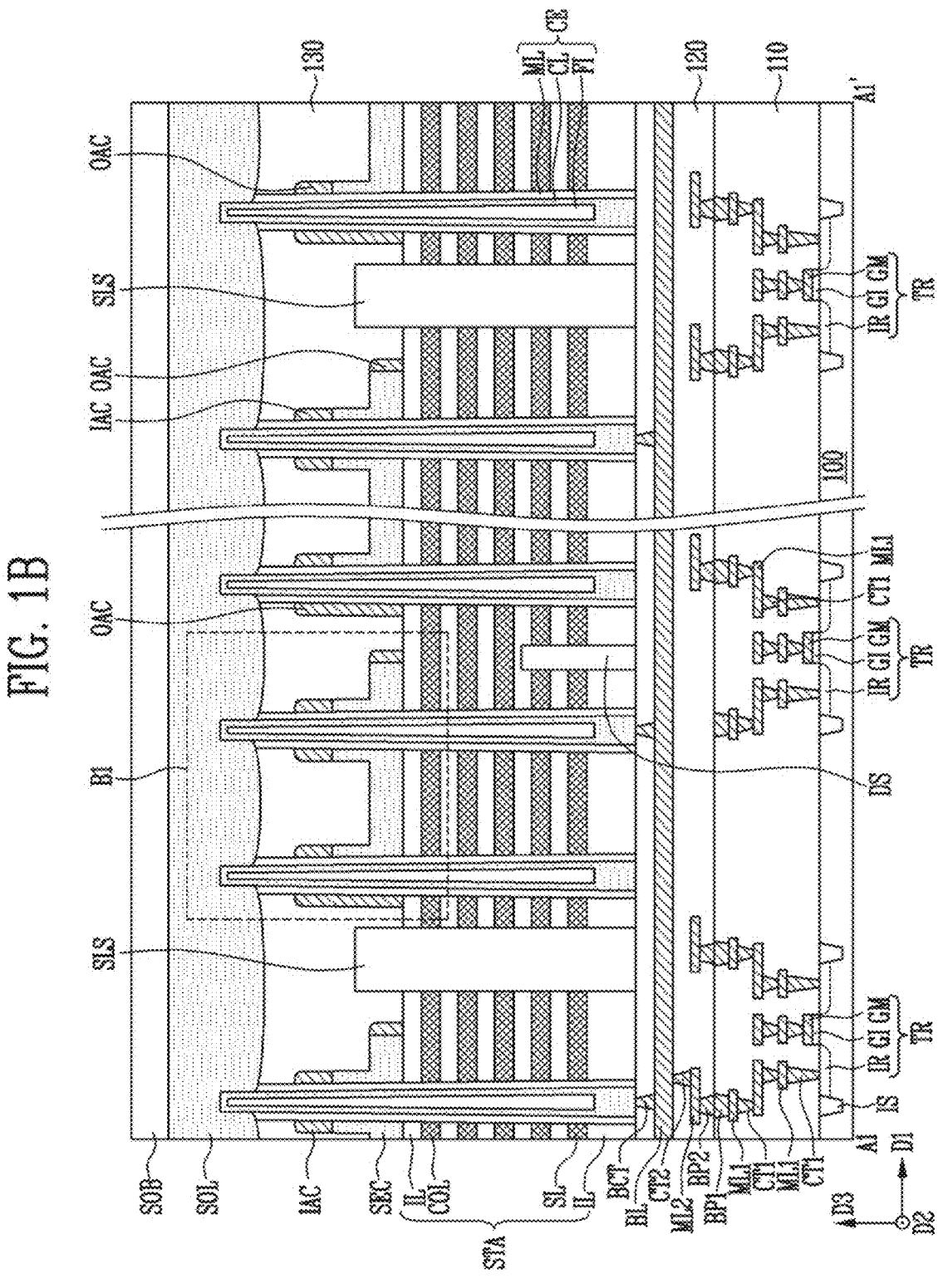
FIG. 1B is a sectional view of the semiconductor device taken along line A1-A1' shown in FIG. 1A.
Figure 1C:
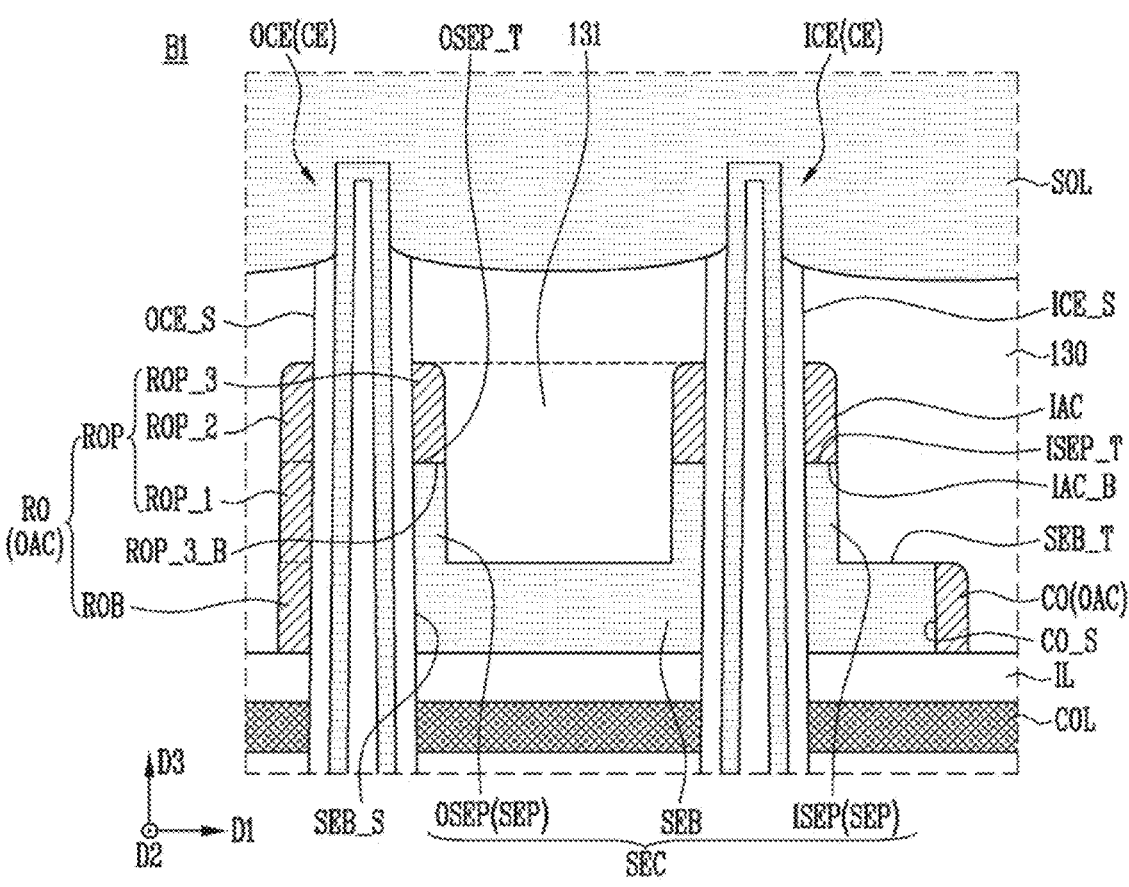
FIG. 1C is an enlarged view of region B1 shown in FIG. 1B.
Figure 1D:
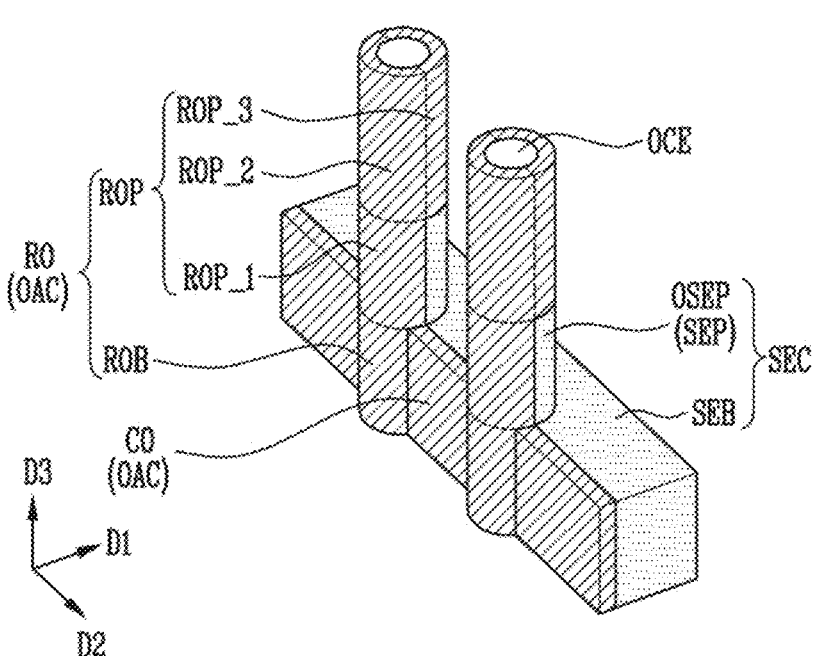
FIG. 1D is a perspective view illustrating an outer auxiliary conductor and an outer cell plug of the semiconductor device shown in FIGS. 1A to 1C.
Figure 1E:
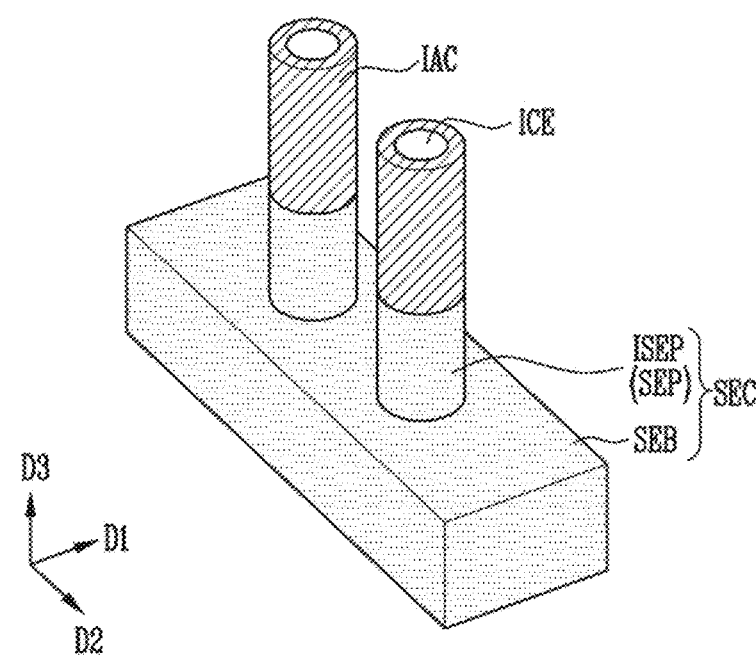
FIG. 1E is a perspective view illustrating an inner auxiliary conductor and an inner cell plug of the semiconductor device shown in FIGS. 1A to 1C.

FIG. 1A is a plan view of a semiconductor device in accordance with an embodiment of the present disclosure. FIG. 1B is a sectional view of the semiconductor device taken along line A1-A1' shown in FIG. 1A. FIG. 1C is an enlarged view of region B1 shown in FIG. 1B. FIG. 1D is a perspective view illustrating an outer auxiliary conductor and an outer cell plug of the semiconductor device shown in FIGS. 1A to 1C. FIG. 1E is a perspective view illustrating an inner auxiliary conductor and an inner cell plug of the semiconductor device shown in FIGS. 1A to 1C.

Figure 11:
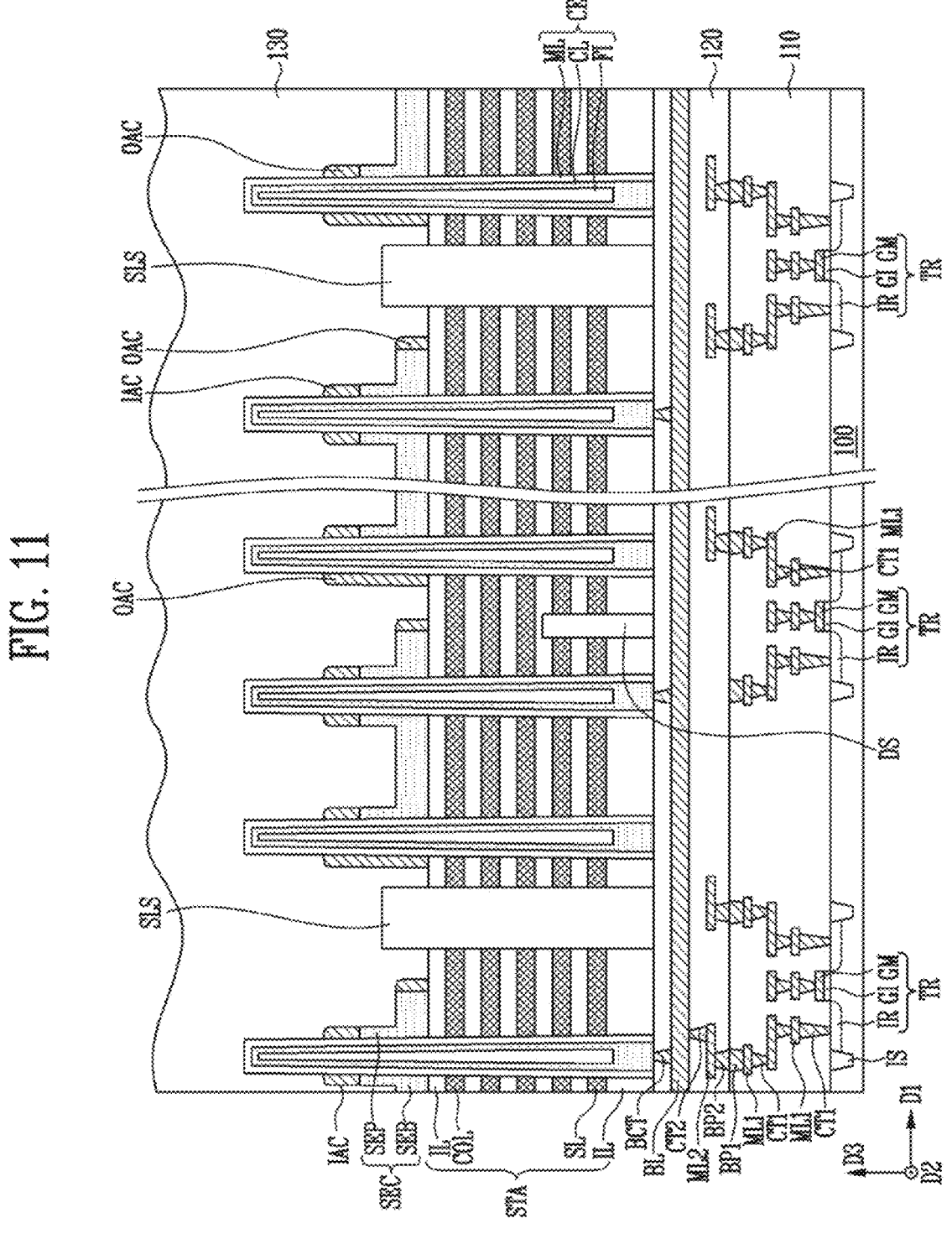

Referring to FIGS. 1A and 11, the semiconductor device may include a first substrate 100. The first substrate 100 may have the shape of a plate extending along a plane defined by a first direction D1 and a second direction D2. The first direction D1 and the second direction D2 may be directions in which axes intersecting each other face. In an example, the first direction D1 and the second direction D2 may be directions in which axes orthogonal to each other face. In an embodiment, the first substrate 100 may be a semiconductor substrate.

A first insulating layer 110 may be provided, which covers the first substrate 100. The first insulating layer 110 may include an insulating material. In an embodiment, the first insulating layer 110 may include oxide or nitride.

Peripheral transistors TR may be provided between the first insulating layer 110 and the first substrate 100. The peripheral transistors TR may constitute a peripheral circuit of the semiconductor device. In an embodiment, the peripheral transistors TR may constitute a page buffer of the semiconductor device.

Each of the peripheral transistors TR may include impurity regions IR, a gate insulating layer GI, and a gate electrode GM. The impurity regions IR may be formed by doping an impurity into the first substrate 100. The gate electrode GM may be spaced apart from the first substrate 100 by the gate insulating layer GI. The gate insulating layer GI may include an insulating material. In an example, the gate insulating layer GI may include oxide. The gate electrode GM may include a conductive material. In an example, the gate electrode GM may include tungsten.

Isolation layers IS may be provided in the first substrate 100. The isolation layers IS may electrically isolate the peripheral transistors TR from each other. The isolation layers IS may include an insulating material. In an embodiment, the isolation layers IS may include oxide.

First contacts CT1 and first lines ML1 may be provided in the first insulating layer 110. The first contact CT1 may connect the peripheral transistor TR and the first line ML1 to each other, or connect the first lines ML1 disposed in different layers to each other. The first contacts CT1 and the first lines ML1 may include a conductive material. In an embodiment, the first contacts CT1 and the first lines ML1 may include tungsten.

First bonding pads BP1 may be provided in the first insulating layer 110. The first bonding pad BP1 may be connected to the first line ML1. A width of the first bonding pad BP1 may become smaller as becoming closer to the first substrate 100 or the peripheral transistor TR. For example, a width of the first bonding pad BP1 in the first direction D1 may become smaller as becoming closer to the first substrate 100. The first bonding pad BP1 may include a conductive material. In an embodiment, the first bonding pad BP1 may include copper.

The first insulating layer 110 may be covered with the second insulating layer 120. The second insulating layer 120 may include an insulating material. In an embodiment, the second insulating layer 120 may include oxide or nitride.

Second bonding pads BP2 may be provided in the second insulating layer 120. The second bonding pad BP2 may be connected to the first bonding pad BP1. The second bonding pad BP2 may be in contact with the first bonding pad BP1. A width of the second bonding pad BP2 may become larger as becoming closer to the first bonding pad BP1. For example, a width of the second bonding pad BP2 in the first direction D1 may become larger as becoming closer to the first bonding pad BP1. The width of the first bonding pad BP1 may become larger as becoming closer to the second bonding pad BP2. For example, the width of the first bonding pad BP1 in the first direction D1 may become larger as becoming closer to the second bonding pad BP2.

Second lines ML2 and a second contact CT2 may be provided in the second insulating layer 120. The second line ML2 may be connected to the second bonding pad BP2. The second contact CT2 may be connected to the second line ML2. The second lines ML2 and the second contact CT2 may include a conductive material. In an embodiment, the second lines ML2 and the second contact CT2 may include tungsten.

A bit line BL may be provided in the second insulating layer 120. The bit line BL may be connected to the second contact CT2. The bit line BL may be electrically connected to the peripheral transistor TR through the second contact CT2, the second line ML2, the second bonding pad BP2, the first bonding pad BP1, the first lines ML1, and the first contacts CT1. The bit line BL may extend in the first direction D1. The bit line BL may include a conductive material. In an embodiment, the bit line BL may include tungsten.

A bit line contact BCT may be formed in the second insulating m layer 120. The bit line contact BCT may be connected to the bit line BL. The bit line contact BCT may include a conductive material. In an embodiment, the bit line contact BCT may include tungsten.

A stack structure STA may be formed on the second insulating layer 120. The stack structure STA may include select layers SL, conductive layers COL, and interlayer insulating layers IL. The select layers SL and the interlayer insulating layers IL may be alternately stacked in a third direction D3. The third direction D3 may be a direction in which an axis intersecting a top surface of the first substrate 100 faces. In an embodiment, the third direction D3 may be a direction in which an axis orthogonal to the top surface of the first substrate 100 faces. The conductive layers COL and the interlayer insulating layers IL may be alternately stacked in the third direction D3. The select layers SL, the conductive layers COL, and the interlayer insulating layers IL may overlap with each other in the third direction D3. The select layers SL may be disposed at a level lower than that of the conductive layers COL.

The select layers SL may be used as select lines of the semiconductor device. The select layers SL may be used as drain select lines of the semiconductor device. The conductive layers COL may be used as word lines of the semiconductor device. The select layers SL and the conductive layers COL may include the same conductive material. In an embodiment, the select layers SL and the conductive layers COL may include tungsten. The interlayer insulating layers IL may include an insulating material. In an embodiment, the interlayer insulating layers IL may include oxide.

Cell plugs CE may penetrate the stack structure STA. The cell plugs CE may extend in the third direction D3. In an embodiment, a length direction of the cell plugs CE may be defined as the third direction D3. The cell plug CE may include a filling layer FI, a channel layer CL surrounding the filling layer FI, and a memory layer ML surrounding the channel layer CL. The filling layer FI, the channel layer CL, and the memory layer ML may penetrate the stack structure STA while extending in the third direction D3. The channel layer CL may be connected to the bit line contact BCT. The channel layer CL may be electrically connected to the bit line BL through the bit line contact BCT.

The filling layer FI may include an insulating material. In an embodiment, the filling layer FI may include oxide. The channel layer CL may include a semiconductor material. In an embodiment, the channel layer CL may include poly-silicon. The memory layer ML may include a tunnel insulating layer surrounding the channel layer CL, a data storage layer surrounding the tunnel insulating layer, and a blocking insulating layer surrounding the data storage layer. The tunnel insulating layer may include a material through which charges can tunnel. In an example, the tunnel insulating layer may include oxide. In an embodiment, the data storage layer may include a material in which charges can be trapped. For example, the data storage layer may include nitride. The data storage layer may include various materials according to a data storage method. In an embodiment, the data storage layer may include silicon, a phase change material, or nano dots. The blocking layer may include a material capable of blocking movement of charges. In an embodiment, the blocking layer may include oxide.

An isolation structure DS may be formed in the stack structure STA. The isolation structure DS may be formed between the cell plugs CE. The isolation structure DS may extend in the second direction D2 and the third direction D3. The isolation structure DS may be disposed between select layers SL spaced apart from each other in the first direction D1. The select layers SL spaced apart from each other in the first direction D1 by the isolation structure DS may be electrically isolated from each other. Interlayer insulating layers IL disposed under the conductive layers COL may be isolated from each other in the first direction D1 by the isolation structure DS. The isolation structure DS may be in contact with the select layers SL. The isolation structure DS may be spaced apart from the conductive layers COL. The isolation structure DS may include an insulating material. In an embodiment, the isolation structure DS may include oxide.

Slit structures SLS may penetrate the stack structure STA. The slit structure SLS may be formed between the cell plugs CE. The slit structure SLS may extend in the second direction D2 and the third direction D3. The select layers SL, the interlayer insulating layers IL, and the conductive layers COL may be isolated from each other in the first direction D1 by the slit structure SLS. A top surface of the slit structure SLS may be disposed at a level higher than that of a top surface of the stack structure STA. The slit structure SLS may further protrude in the third direction D3 than the stack structure STA. The slit structure SLS may include an insulating material. In an embodiment, the slit structure SLS may include oxide.

Select conductors SEC may be formed on the stack structure STA. The select conductor SEC may be formed on the interlayer insulating layer IL of the stack structure STA. Two or more select conductors SEC may be provided between slit structures SLS adjacent to each other. Each select conductor SEC may surround the cell plugs CE. The select conductor SEC may include a conductive material. In an embodiment, the select conductor SEC may include poly-silicon.

Outer auxiliary conductors OAC and inner auxiliary conductors IAC may be in contact with the select conductor SEC. The outer auxiliary conductors OAC may be disposed at both sides of the select conductor SEC. The select conductor SEC may be disposed between the outer auxiliary conductors OAC. The inner auxiliary conductors IAC may be disposed between the outer auxiliary conductors OAC. The outer auxiliary conductor OAC and the inner auxiliary conductor IAC may include the same conductive material. The conductive material which the outer auxiliary conductor OAC and the inner auxiliary conductor IAC include may be different from that which the select conductor SEC includes. In an embodiment, the outer auxiliary conductor OAC and the inner auxiliary conductor IAC may include titanium nitride.

A structure including the select conductor SEC, the outer auxiliary conductors OAC, and the inner auxiliary conductors IAC may be used as a select line of the semiconductor device. In an embodiment, the structure including the select conductor SEC, the outer auxiliary conductors OAC, and the inner auxiliary conductors IAC may be used as a source select line of the semiconductor device.

A third insulating layer 130 may covers the stack structure STA, the slit structures SLS, the select conductors SEC, the outer auxiliary conductors OAC, and the inner auxiliary conductors IAC. The third insulating layer 130 may include an insulating material. In an embodiment, the third insulating layer 130 may include oxide or nitride.

A source layer SOL may be formed on the third insulating layer 130. The source layer SOL may be connected to the channel layers CL of the cell plugs CE. The source layer SOL may be in contact with the channel layers CL of the cell plugs CE. The source layer SOL may be electrically connected to the channel layers CL of the cell plugs CE. The source layer SOL may surround an upper portion of the channel layer CL of the cell plug CE. An uppermost portion of the channel layer CL of the cell plug CE may be provided in the source layer SOL. The source layer SOL may include a conductive material. In an embodiment, the source layer SOL may include doped poly-silicon.

A source barrier layer SOB may be formed on the source layer SOL. The source barrier layer SOB may be in contact with the source layer SOL. The source barrier layer SOB may include a conductive material. In an embodiment, the source barrier layer SOB may include at least one of titanium and tungsten.

Referring to FIGS. 1A, 1C, 1D, and 1E, the select conductor SEC may include a select base part SEB and select protrusion parts SEP. The select base part SEB may surround a plurality of cell plugs CE. The select base part SEB may be formed on the stack structure STA. The select base part SEB may be in contact with the interlayer insulating layer IL disposed at an uppermost portion of the stack structure STA. The select base part SEB may overlap with the outer auxiliary conductors OAC and the inner auxiliary conductors IAC. For example, some of the outer auxiliary conductors OAC and the select base part SEB may be aligned in the third direction D3, and each inner auxiliary conductor IAC and the select base part SEB may be aligned in the third direction D3.

The select protrusion parts SEP may protrude from the select base part SEB. In an embodiment, the select protrusion parts SEP may extend in the third direction D3 from the select base part SEB. For example, as shown in FIG. 1C, the select protrusion parts SEP may extend in the third direction D3 from a top surface SEB_T of the select base part SEB. The select protrusion parts SEP may be disposed at a level higher than that of the select base part SEB. The select protrusion parts SEP may respectively surround portions of the cell plugs CE protruding beyond the select base part SEB. The select protrusion parts SEP may be spaced apart from each other. The select base part SEB may be connected to the select protrusion parts SEP.

The cell plugs CE may penetrate the select conductor SEC. The cell plugs CE may include inner cell plugs ICE and outer cell plugs OCE. The inner cell plugs ICE may be surrounded by the select base part SEB of the select conductor SEC. The outer cell plugs OCE may be disposed at both sides of the select base part SEB of the select conductor SEC.

The select base part SEB of the select conductor SEC may be in contact with sidewalls OCE_S of the outer cell plugs OCE and sidewalls ICE_S of the inner cell plugs ICE. For example, as shown in FIG. 1C, the sidewall OCE_S of each of the outer cell plugs OCE may include a part in contact with a sidewall SEB_S of the select base part SEB of the select conductor SEC and a part in contact with one of the outer auxiliary conductors OAC.

As shown in FIGS. 1C to 1E, the select protrusion parts SEP may include outer select protrusion parts OSEP and inner select protrusion parts ISEP. As shown in FIGS. 1C and 1E, the inner select protrusion parts ISEP may respectively surround portions of the inner cell plugs ICE protruding beyond the select base part SEB. As shown in FIG. 1C, the inner select protrusion part ISEP may be in contact with the sidewall ICE_S of the inner cell plug ICE. As shown in FIG. 1C, the outer select protrusion part OSEP may be in contact with the sidewall OCE_S of the outer cell plug OCE.

As shown in FIGS. 1A, 1C, and 1D, the outer auxiliary conductor OAC may include round parts RO and connection parts CO. The round parts RO and the connection parts CO of the outer auxiliary conductor OAC may be provided on the stack structure STA shown in FIG. 1B. The round parts RO and the connection parts CO of the outer auxiliary conductor OAC may be in contact with the interlayer insulating layer IL at the uppermost portion of the stack structure STA. The round part RO may surround the outer cell plug OCE. The round part RO may be in contact with the sidewall OCE_S of the outer cell plug OCE. The round part RO may surround a portion of the outer cell plug OCE protruding beyond the select conductor SEC.

The connection part CO may connect adjacent round parts RO to each other. The connection part CO may be connected to the select base part SEB of the select conductor SEC. A sidewall CO_S of the connection part CO may be in contact with the sidewall SEB_S of the select base part SEB of the select conductor SEC. The connection part CO may be disposed at the same level as the select base part SEB of the select conductor SEC. The connection part CO may be disposed at a level lower than that of the select protrusion parts SEP of the select conductor SEC.

As shown in FIGS. 1C and 1D, the round part RO may include a round base part ROB and a round protrusion part ROP. The round base part ROB may be disposed at the same level as the connection part CO. The round base part ROB may be connected to the connection part CO. The connection part CO may extend in the second direction D2 from the round base part ROB. The round base part ROB may be disposed at the same level as the select base part SEB of the select conductor SEC. The outer cell plug OCE may be disposed between the round base part ROB and the select base part SEB of the select conductor SEC. A sidewall of the round base part ROB may be in contact with the sidewall OCE_S of the outer cell plug OCE.

The round protrusion part ROP may extend in the third direction D3 from the round base part ROB. The round protrusion part ROP may extend up to a level higher than that of the select base part SEB of the select conductor SEC. The round protrusion part ROP may be disposed at a level higher than that of the connection part CO. The round protrusion part ROP may extend onto the outer select protrusion part OSEP of the select conductor SEC. The round protrusion part ROP may surround the outer cell plug OCE. A sidewall of the round protrusion part ROP may be in contact with the sidewall OCE_S of the outer cell plug OCE.

The round protrusion part ROP may include a first part ROP_1, a second part ROP_2, and a third part ROP_3.

The first part ROP_1 of the round protrusion part ROP may be disposed at a level higher than that of the round base part ROB. The first part ROP_1 of the round protrusion part ROP may be disposed at a level higher than that of the select base part SEB of the select conductor SEC. The first part ROP_1 of the round protrusion part ROP may be disposed at a level higher than that of the connection part CO. The first part ROP_1 of the round protrusion part ROP may be disposed at the same level as the select protrusion part SEP of the select conductor SEC. The first part ROP_1 of the round protrusion part ROP may be connected to the outer select protrusion part OSEP of the select conductor SEC. The outer cell plug OCE may be disposed between the first part ROP_1 of the round protrusion part ROP and the outer select protrusion part OSEP of the select conductor SEC. The first part ROP_1 of the round protrusion part ROP may extend in the third direction D3 from the round base part ROB.

The second part ROP_2 of the round protrusion part ROP may be disposed at a level higher than that of the first part ROP_1 of the round protrusion part ROP. The second part ROP_2 of the round protrusion part ROP may be disposed at a level higher than that of the select protrusion part SEP of the select conductor SEC. The second part ROP_2 of the round protrusion part ROP may extend in the third direction from the first part ROP_1 of the round protrusion part ROP. The first part ROP_1 of the round protrusion part ROP may be disposed between the second part ROP_2 of the round protrusion part ROP and the round base part ROB.

The third part ROP_3 of the round protrusion part ROP may be disposed at a level higher than that of the first part ROP_I of the round protrusion part ROP. The third part ROP_3 of the round protrusion part ROP may be disposed at a level higher than that of the select protrusion part SEP of the select conductor SEC. The third part ROP_3 of the round protrusion part ROP may be disposed at the same level as the second part ROP_2 of the round protrusion part ROP. The third part ROP_3 of the round protrusion part ROP may be connected to the second part ROP_2 of the round protrusion part ROP. The outer cell plug OCE may be disposed between the third part ROP_3 of the round protrusion part ROP and the second part ROP_2 of the round protrusion part ROP. The third part ROP_3 of the round protrusion part ROP may overlap with the outer select protrusion part OSEP of the select conductor SEC and the select base part SEB. In an embodiment, the third part ROP_3 of the round protrusion part ROP may overlap with the outer select protrusion part OSEP of the select conductor SEC and the select base part SEB in the third direction D3. As shown in FIG. 1C, a bottom surface ROP_3_B of the third part ROP_3 of the round protrusion part ROP may form a common surface with a top surface OSEP_T of the outer select protrusion part OSEP of the select conductor SEC.

As shown in FIGS. 1C and 1E, the inner auxiliary conductor IAC may be provided on the inner select protrusion part ISEP of the select conductor SEC. As shown in FIG. 1C, a bottom surface IAC_B of the inner auxiliary conductor IAC may form a common surface with a top surface ISEP_T of the inner select protrusion part ISEP of the select conductor SEC. The inner auxiliary conductor IAC may surround a portion of the inner cell plug ICE protruding beyond the select conductor SEC. The inner auxiliary conductor IAC may be in contact with the sidewall ICE_S of the inner cell plug ICE. The inner auxiliary conductor IAC may be disposed at a level higher than that of the inner select protrusion part ISEP of the select conductor SEC. The inner auxiliary conductor IAC may be disposed at the same level as the second and third parts ROP_2 and ROP_3 of the round protrusion part ROP of the outer auxiliary conductor OAC.

As shown in FIG. 1C, the third insulating layer 130 may include an interposition part 131 interposed between the outer auxiliary conductor OAC and the inner auxiliary conductor IAC and between the outer select protrusion part OSEP and the inner select protrusion part ISEP. The interposition part 131 of the third insulating layer 130 may be interposed between the third part ROP_3 of the round protrusion part ROP and the inner auxiliary conductor IAC. The interposition part 131 of the third insulating layer 130 may be in contact with the third part ROP_3 of the round protrusion part ROP and the inner auxiliary conductor IAC. The interposition part 131 of the third insulating layer 130 may be in contact with the outer select protrusion part OSEP and the inner select protrusion part ISEP of the select conductor SEC. The interposition part 131 of the third insulating layer 130 may be in contact with the top surface SEB_T of the select base part SEB of the select conductor SEC.

In the semiconductor device described with reference to FIGS. 1A to 1E, the select conductor SEC, the outer auxiliary conductor OAC, and the inner auxiliary conductor IAC, which may be used as a source select line, may be formed independently from the conductive layer COL and the select layer SL. Accordingly, a number of columns of the cell plugs CE controlled by the source select line may be independently designed. In an embodiment, the number of columns of the cell plugs CE controlled by the source select line may be designed to be equal to that of columns of the cell plugs CE controlled by a drain select line, so that disturb of a read operation may be reduced. However, the embodiment of the present disclosure is not limited thereto. In order to reduce the disturb of the read operation, the source select line may be designed such that the number of columns of the cell plugs CE controlled by the source select line is smaller than that of columns of cell plugs CE controlled by the drain select line.

In the semiconductor device described with reference to FIGS. 1A to 1E, because the select conductor SEC, the outer auxiliary conductors OAC, and the inner auxiliary conductors IAC constitute the source select line, an RC delay of the source select line may be reduced. For example, a resistance of a source select line having a structure in which the outer auxiliary conductors OAC and the inner auxiliary conductors IAC are connected to the select conductor SEC is smaller than that of a source select line configured with only the select conductor SEC. Thus, in accordance with the embodiment of the present disclosure, the RC delay of the source select line may be reduced.

In the semiconductor device described with reference to FIGS. 1A to 1E, a length of each of the select protrusion part SEP, the round protrusion part ROP, and the inner auxiliary conductor IAC in the third direction D3 may be controlled, so that off-characteristics of a source select transistor controlled by the source select line may be controlled. Accordingly, the off-characteristics of the source select transistor may be improved, even when a separate conductive layer for improving the off-characteristics of the source select transistor is not disposed between the select conductor SEC and the conductive layer COL used as a word line. Thus, in accordance with the embodiment of the present disclosure, the separate conductive layer for improving off-characteristics of the source select transistor may be excluded in the stack structure STA shown in FIG. 11B, and accordingly, the height of the stack structure STA in the third direction D3 may be reduced.

FIGS. 2, 3, 4, 5, 6, 7, 8A, 9, 10, 11, and 12 are sectional views illustrating a manufacturing method of the semiconductor device in accordance with an embodiment of the present disclosure. FIG. 8B is a sectional view of the semiconductor device taken along line A2-A2' shown in FIG. 8A. Hereinafter, descriptions of portions overlapping with the descriptions described above will be omitted.

Figure 2:
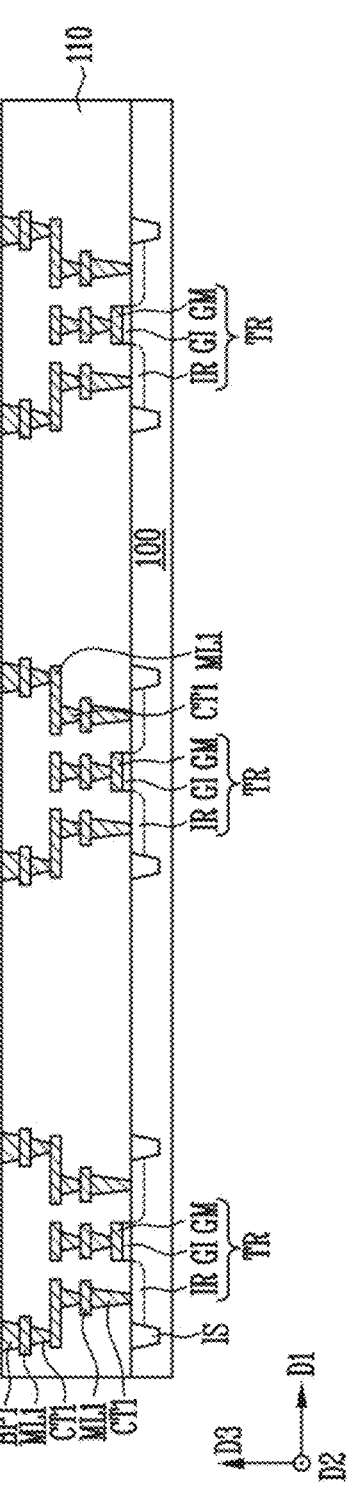

Referring to FIG. 2, a first substrate 100 may be formed. Isolation layers IS may be formed in the first substrate 100. A gate insulating layer GI and a gate electrode GM of each of peripheral transistors TR may be formed on the first substrate 100. Impurity regions IR of each of the peripheral transistors TR may be formed in the first substrate 100 at both sides of the gate electrode GM. First contacts CT1, first lines ML, and first bonding pads BP1 may be formed, which are connected to the peripheral transistors TR. A first insulating layer 110 may be formed to cover the first substrate 100. The gate insulating layer GI and the gate electrode GM may be buried in the first insulating layer 110. The first contacts CT1, the first lines ML1, and the first bonding pads BP1 may be buried in the first insulating layer 110.

Figure 3:
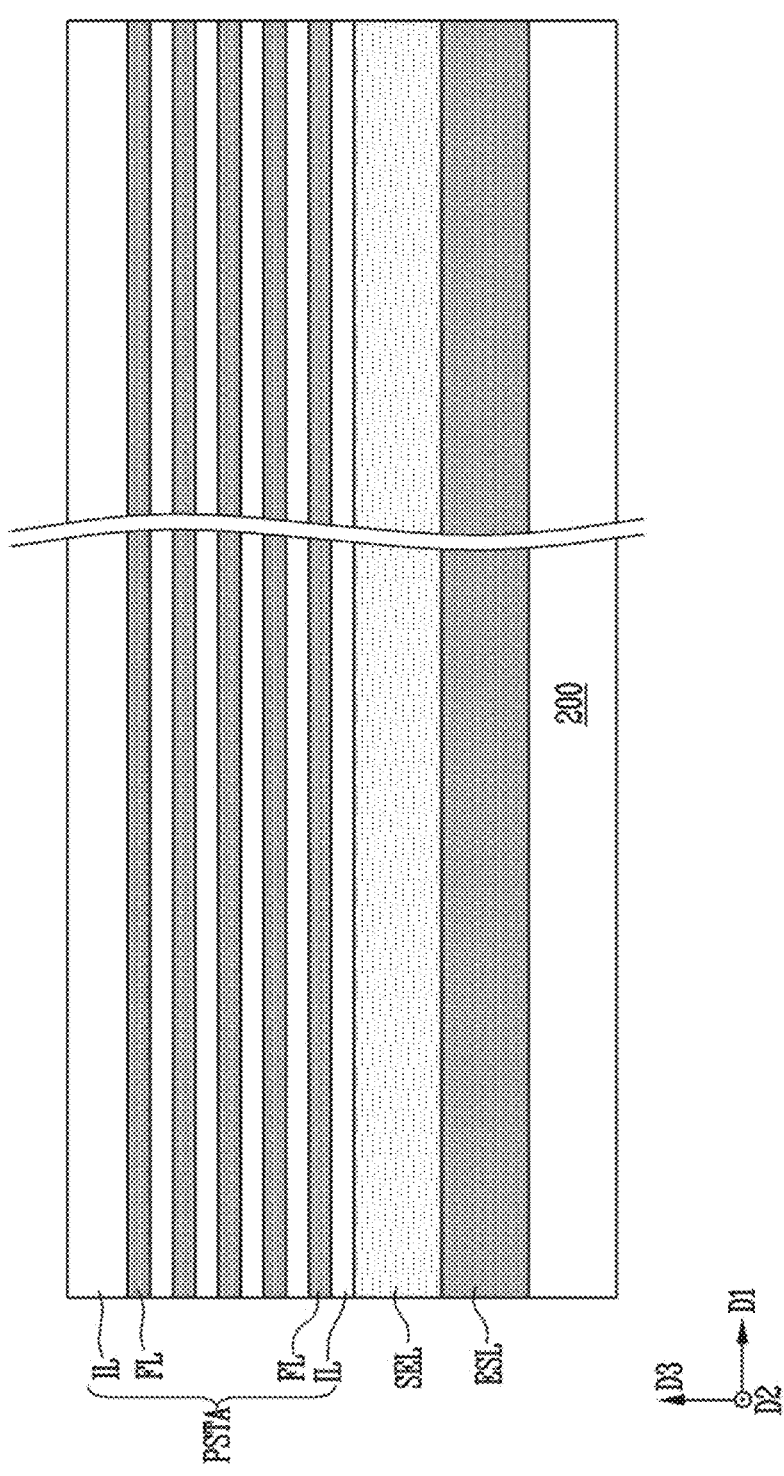

Referring to FIG. 3, a second substrate 200 may be formed. The second substrate 200 may have the shape of a plate extending along a plane defined by the first direction D1 and the second direction D2. In an embodiment, the second substrate 200 may be a semiconductor substrate.

An etch stop layer ESL may be formed on the second substrate 200. A select conductive layer SEL is formed on the etch stop layer ESL. The select conductive layer SEL may include a conductive material. The material which the etch stop layer ESL includes may have an etch selectivity with respect to the material which the select conductive layer SEL includes and the material which the second substrate 200 includes. In an embodiment, the select conductive layer SEL may include poly-silicon, and the etch stop layer ESL may include nitride.

A preliminary stack structure PSTA may be formed on the select conductive layer SEL. The forming of the preliminary stack structure PSTA may include alternately stacking interlayer insulating layers IL and stack sacrificial layers FL in the third direction D3 on the select conductive layer SEL. The interlayer insulating layer IL and the stack sacrificial layer FL may include different materials. In an embodiment, the interlayer insulating layer IL may include oxide, and the stack sacrificial layer FL may include nitride.

Figure 4:
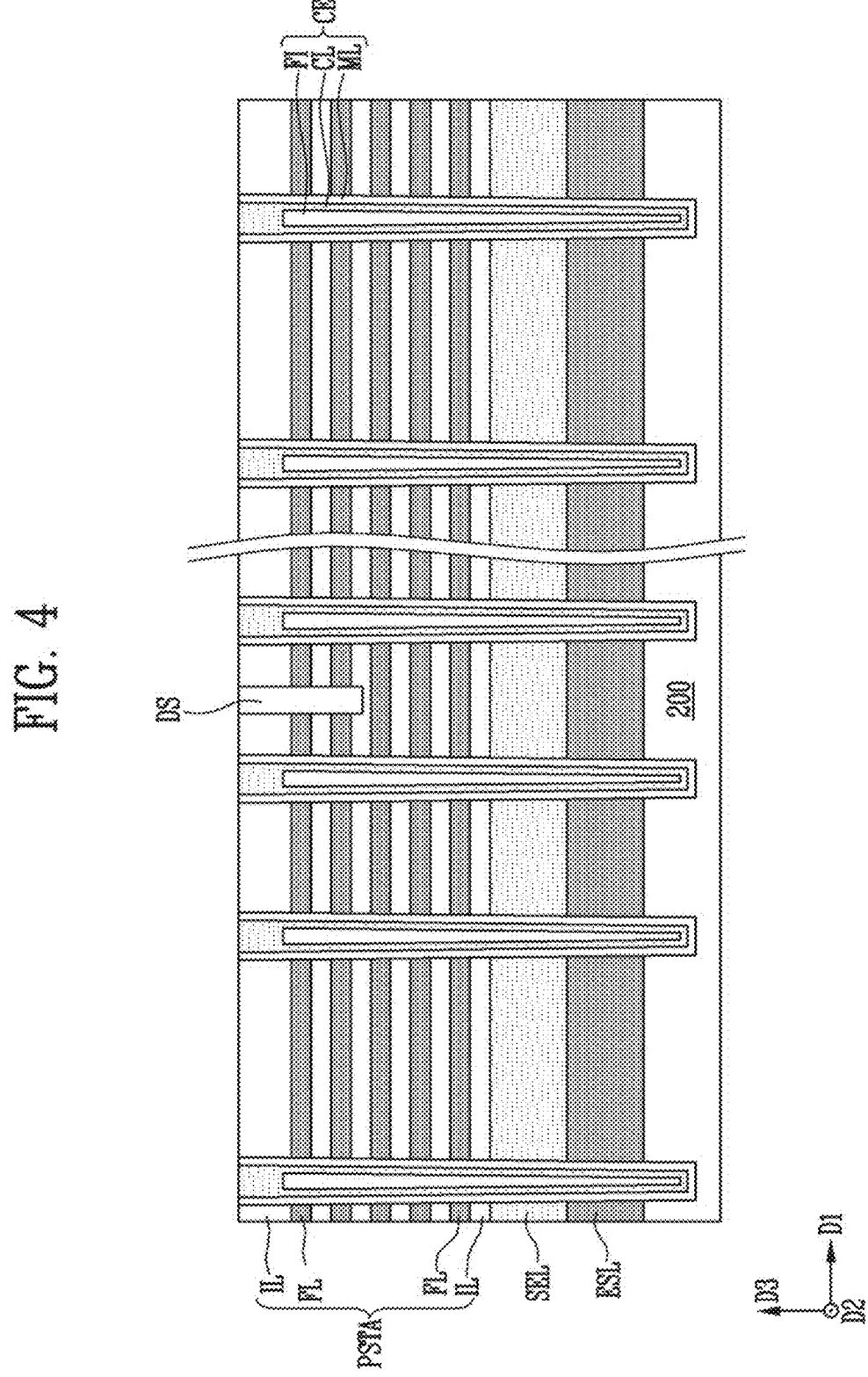

Referring to FIG. 4, cell plugs CE may be formed, which penetrate the preliminary stack structure PSTA and the select conductive layer SEL. The forming of the cell plugs CE may include forming cell plug holes penetrating the preliminary stack structure PSTA and the select conductive layer SEL and forming a memory layer ML, a channel layer CL, and a filling layer FI in the cell plug holes.

An isolation structure DS may be formed in an upper portion of the preliminary stack structure PSTA. The forming of the isolation structure DS may include forming a first slit in the upper portion of the preliminary stack structure PSTA and forming the isolation structure DS in the first slit.

Figure 5:
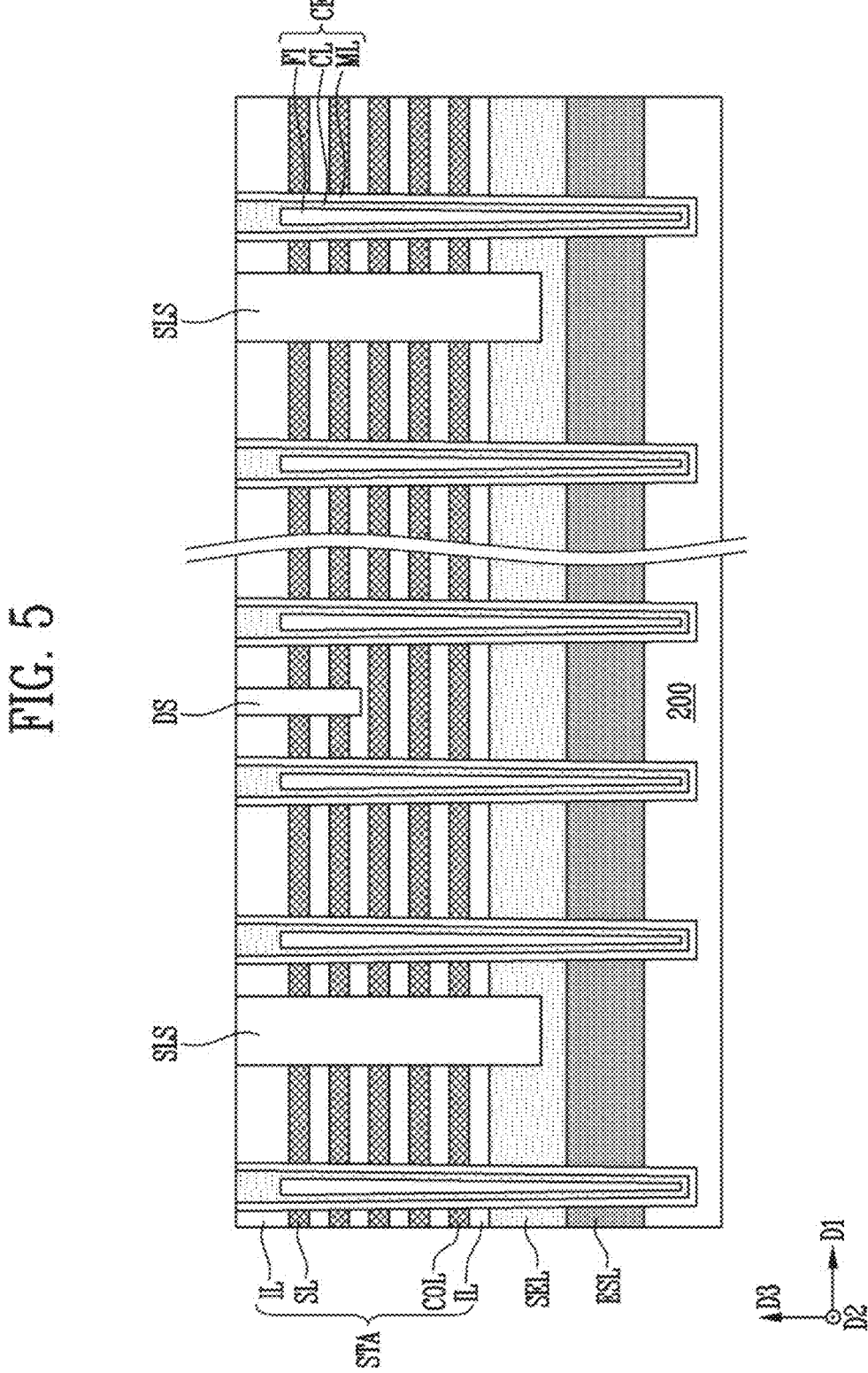

Referring to FIG. 5, slit structures SLS, select layers SL, and conductive layers COL may be formed. The forming of the slit structures SLS, the select layers SL, and the conductive layers COL may include forming second slits penetrating the preliminary stack structure PSTA shown in FIG. 4, removing the stack sacrificial layers FL shown in FIG. 4 through the second slits, forming the select layers SL and the conductive layers COL in empty spaces formed by removing the stack sacrificial layers FL, and forming the slit structures SLS in the second slits. Accordingly, a stack structure STA may be defined. The stack structure may include the select layers SL, the conductive layers COL, and the interlayer insulating layers IL.

Figure 6:
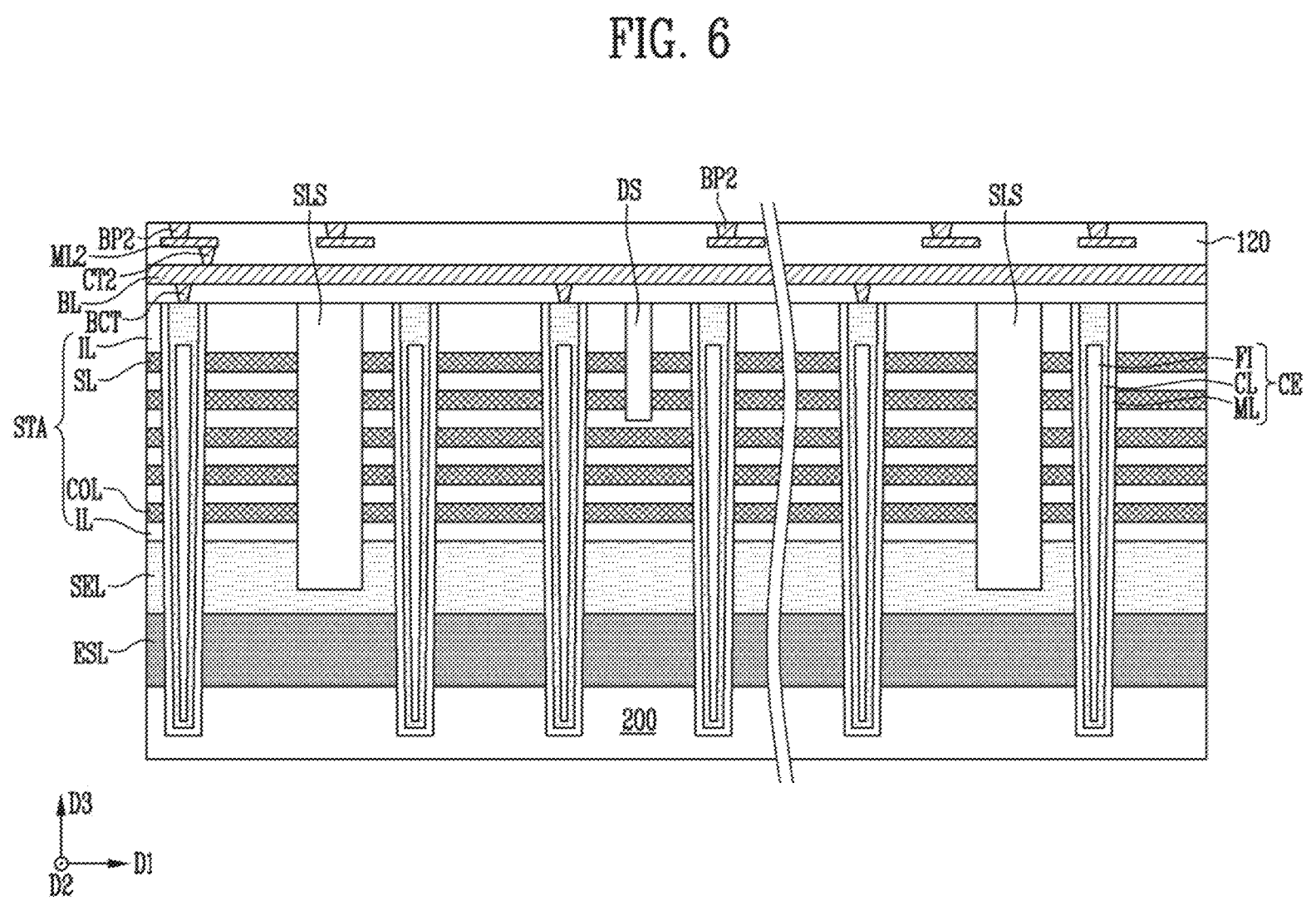

Referring to FIG. 6, a bit line contact BCT, a bit line BL, a second contact CT2, second lines ML2, second bonding pads BP2, and a second insulating layer 120 may be formed. The second insulating layer 120 may cover the stack structure STA. The bit line contact BCT, the bit line BL, the second contact CT2, the second lines ML2, and the second bonding pads BP2 may be buried in the second insulating layer 120.

Figure 7:
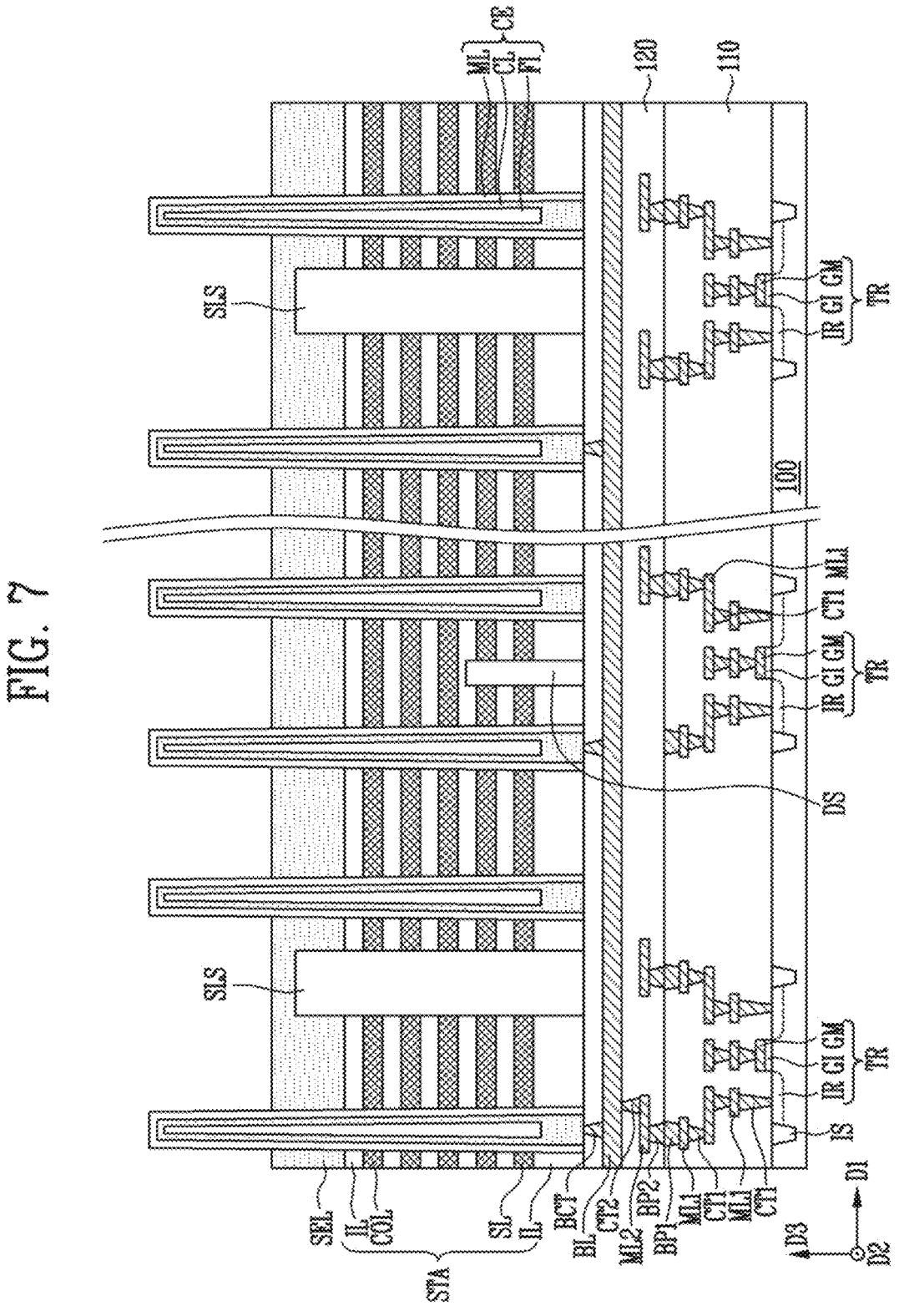

Referring to FIG. 7, the second substrate 200 shown in FIG. 6 may be aligned on the first substrate 100 such that the first bonding pad BP1 and the second bonding pad BP2 face each other.

Subsequently, the second bonding pad BP2 may be bonded to the first bonding pad BP1, and the second insulating layer 120 may be bonded to the first insulating layer 110. When the second bonding pad BP2 is boned to the first bonding pad BP1, the channel layer CL of the cell plug CE may be electrically connected to the peripheral transistor TR through the bit line contact BCT, the bit line BL, the second contact CT2, the second line ML2, the second bonding pad BP2, the first bonding pad BP1, the first line ML1, and the first contact CT1.

Subsequently, the second substrate 200 and the etch stop layer ESL, which are shown in FIG. 7, may be removed. The second substrate 200 and the etch stop layer ESL may be removed to expose an upper portion of the cell plug CE.

Figure 8A:
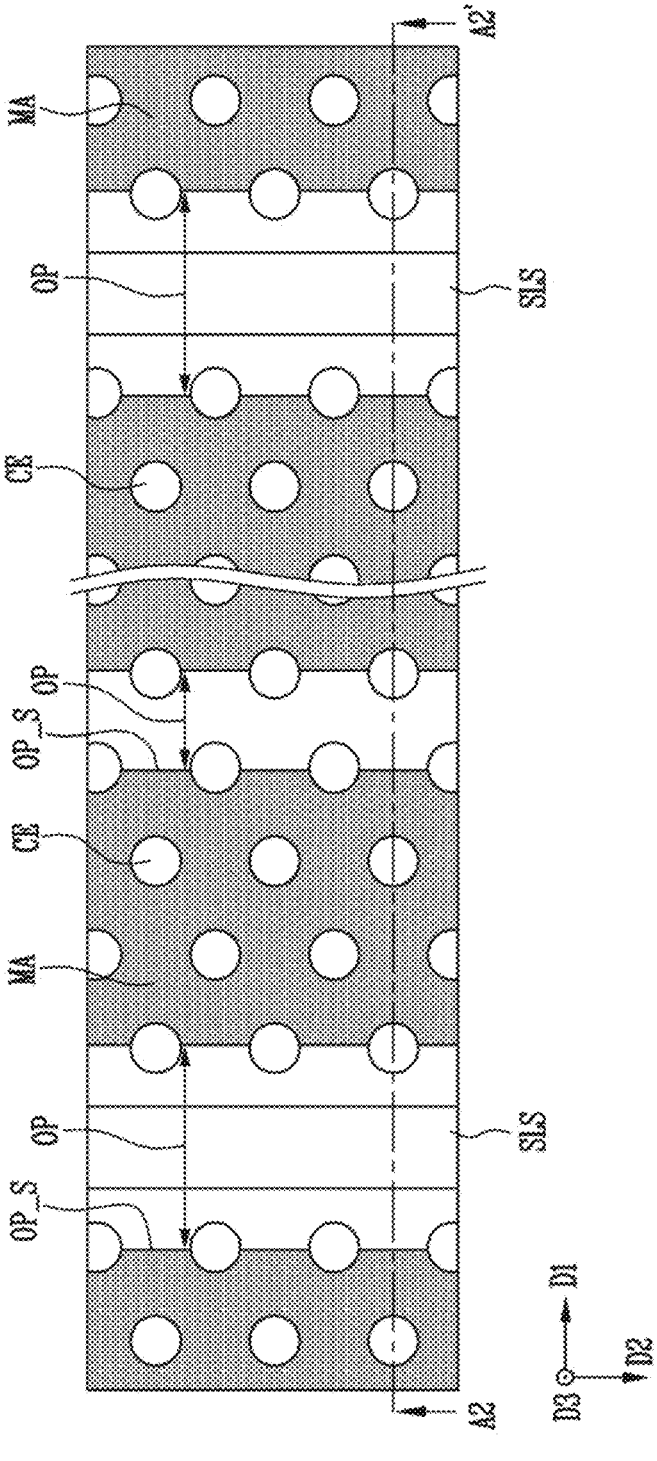
Figure 8B:
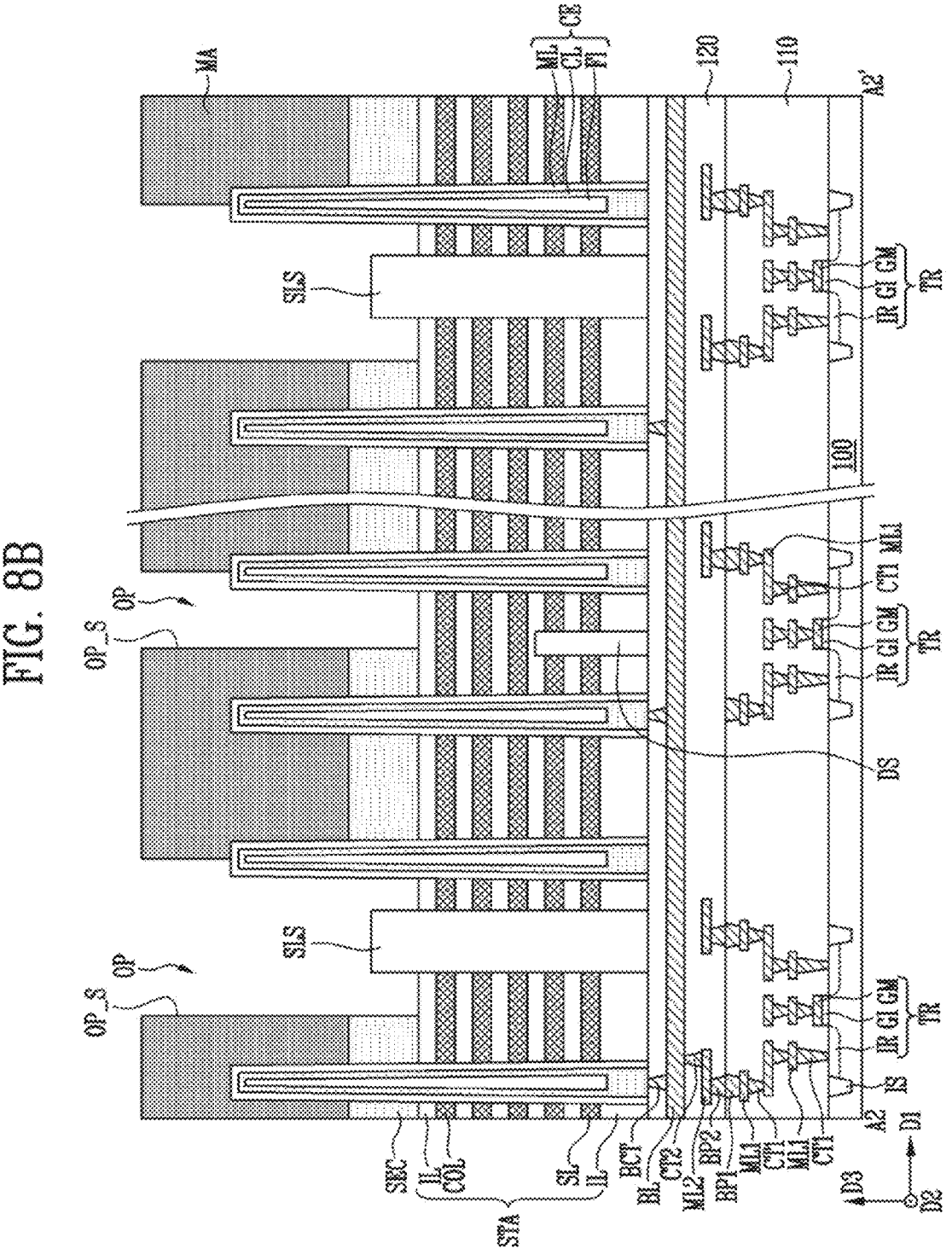
FIG. 8B is a sectional view of the semiconductor device taken along line A2-A2' shown in FIG. 8A.

Referring to FIGS. 8A and 8B, a mask layer MA may be formed on the select conductive layer SEL and the cell plug CE. The mask layer MA may include openings OP. The openings OP of the mask layer MA may penetrate the mask layer MA in the third direction D3. The openings OP of the mask layer MA may extend in the second direction D2. The openings OP of the mask layer MA may include sidewalls OP_S overlapping with some of the cell plugs CE. In an embodiment, the sidewall OP_S of each of the openings OP of the mask layer MA may overlap with cell plugs CE adjacent to the slit structure SLS, or overlap with cell plugs CE adjacent to the isolation structure DS.

The select conductive layer SEL shown in FIG. 7 may be etched by using the mask layer MA as an etch barrier. As a result, select conductors SEC may be formed. Portions of the select conductive layer SEL, which are isolated from each other through etching, may be defined as the select conductors SEC.

The select conductive layer SEL may be etched to expose the slit structures SLS.

Cell plugs CE adjacent to the slit structure SLS among the cell plugs CE may have sidewalls protruding beyond one sidewalls of the select conductors SEC. Cell plugs CE adjacent to the isolation structure DS among the cell plugs CE may have sidewalls protruding beyond the other sidewalls of the select conductors SEC. The cell plugs CE having the sidewalls protruding beyond the sidewalls of the select conductors SEC may be defined as outer cell plugs OCE shown in FIG. 1A.

After the select conductive layer SEL is etched, the mask layer MA may be removed.

Figure 9:
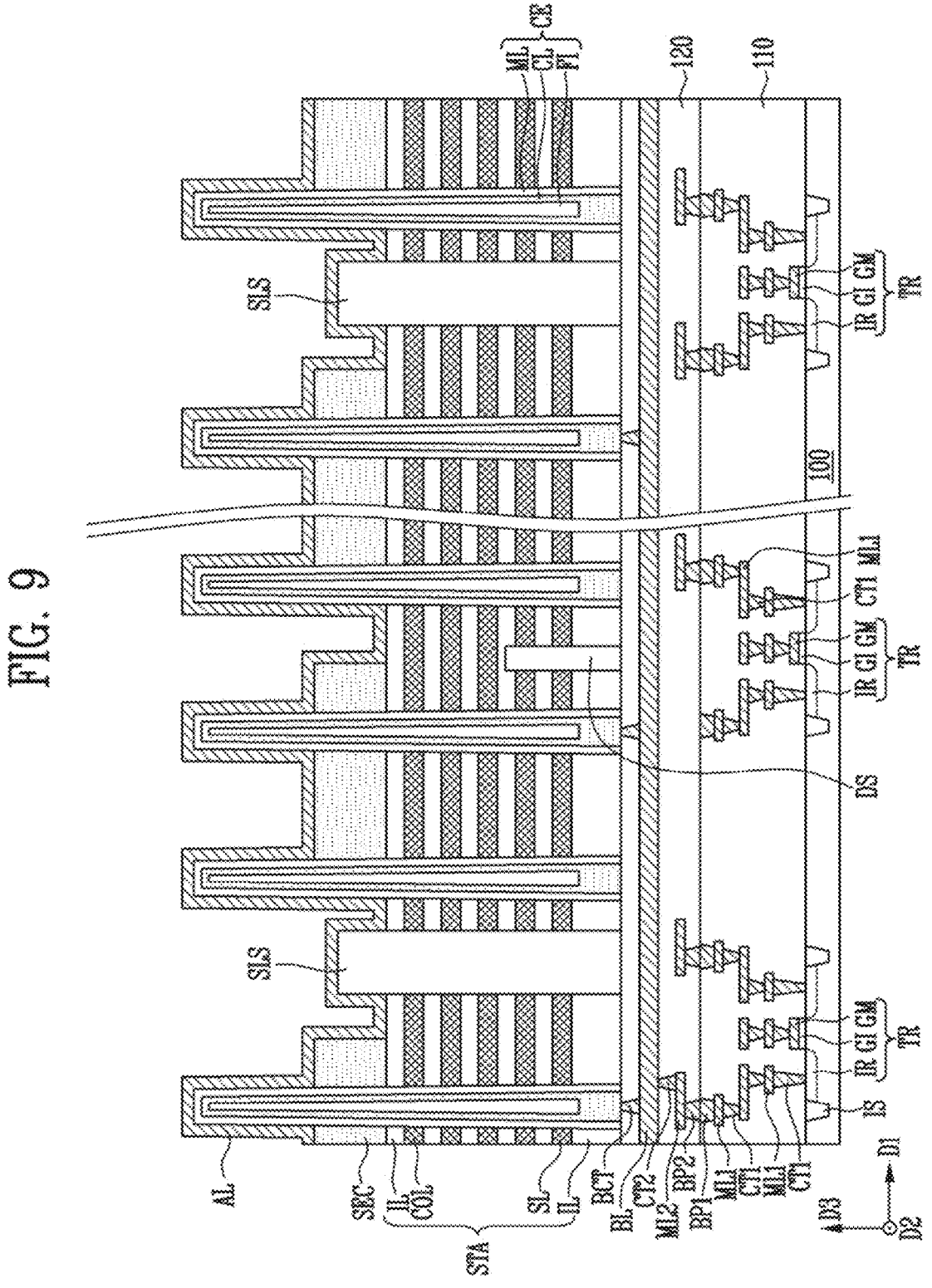

Referring to FIG. 9, an auxiliary conductive layer AL may be formed. In an embodiment, the auxiliary conductive layer AL may be formed through a deposition process. The auxiliary conductive layer AL may conformally cover the cell plugs CE, the select conductors SEC, the slit structures SLS, and the stack structure STA. The auxiliary conductive layer AL may have a uniform thickness. The auxiliary conductive layer AL may include a conductive material different from that of the select conductive layer SEL. In an embodiment, the auxiliary conductive layer AL may include titanium nitride.

Figure 10:
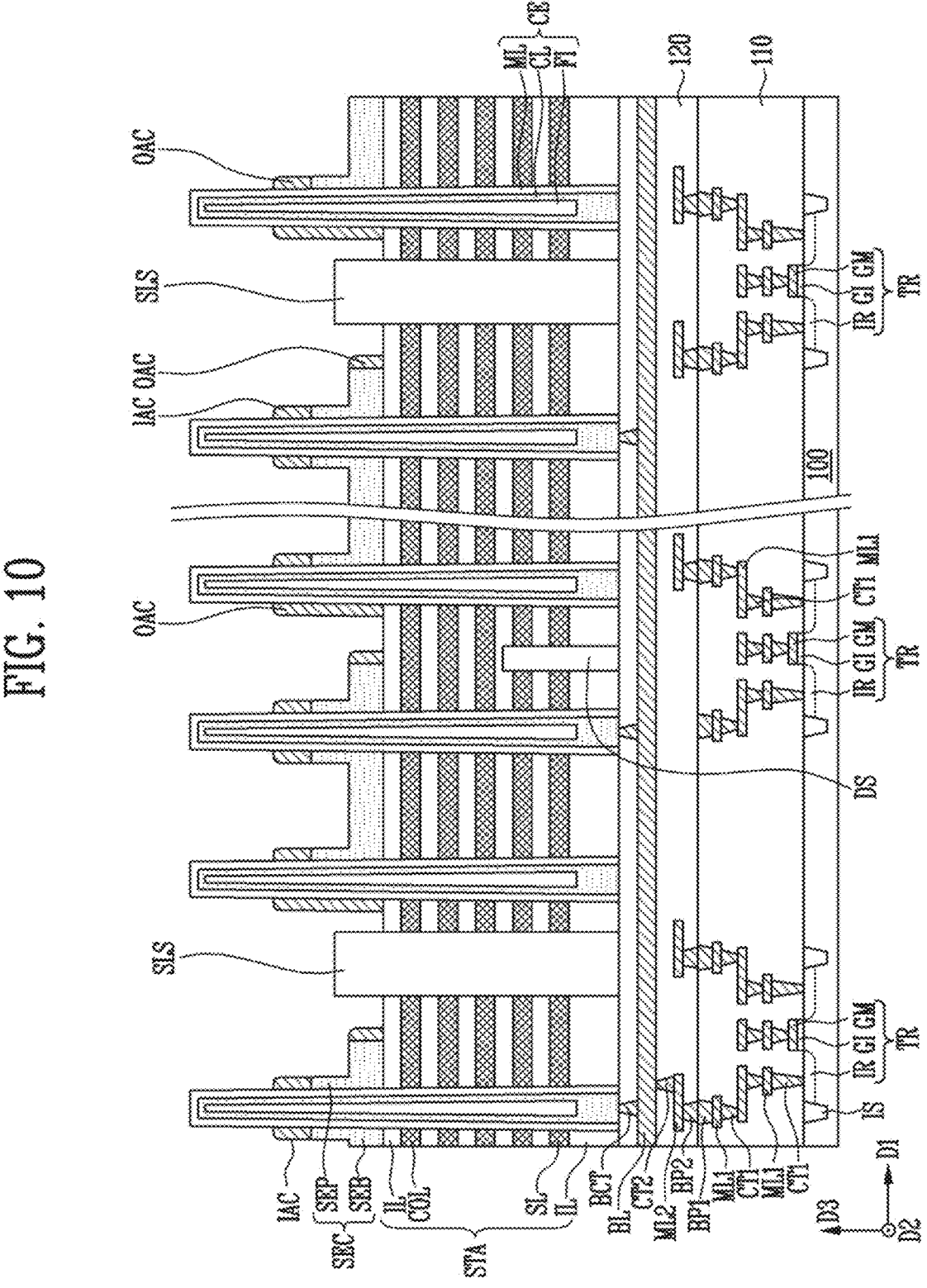

Referring to FIG. 10, the auxiliary conductive layer AL shown in FIG. 9 may be etched. In an embodiment, the auxiliary conductive layer AL may be etched through an etch-back process.

The auxiliary conductive layer AL may be etched so that outer auxiliary conductors OAC and inner auxiliary conductors IAC are formed. Portions of the auxiliary conductive layer AL, which are isolated from each other through etching, may be defined as the outer auxiliary conductors OAC and the inner auxiliary conductors IAC.

The select conductors SEC may be etched together with the etching of the auxiliary conductive layer AL. The auxiliary conductive layer AL may be etched to exposed a top surface of the select conductor SEC. The exposed top surface of the select conductor SEC may be etched. The select conductor SEC may be etched so that a select base part SEB and a select protrusion part SEP of the select conductor SEC are formed.

When the auxiliary conductive layer AL is etched, the select conductors SEC, the cell plugs CE, the slit structures SLS, and the stack structure STA may be again exposed.

Referring to FIG. 11, a third insulating layer 130 may be formed. The third insulating layer 130 may cover the cell plugs CE, the stack structure STA, the slit structures SLS, the outer auxiliary conductors OAC, the inner auxiliary conductors IAC, and the select conductors SEC.

Figure 12:
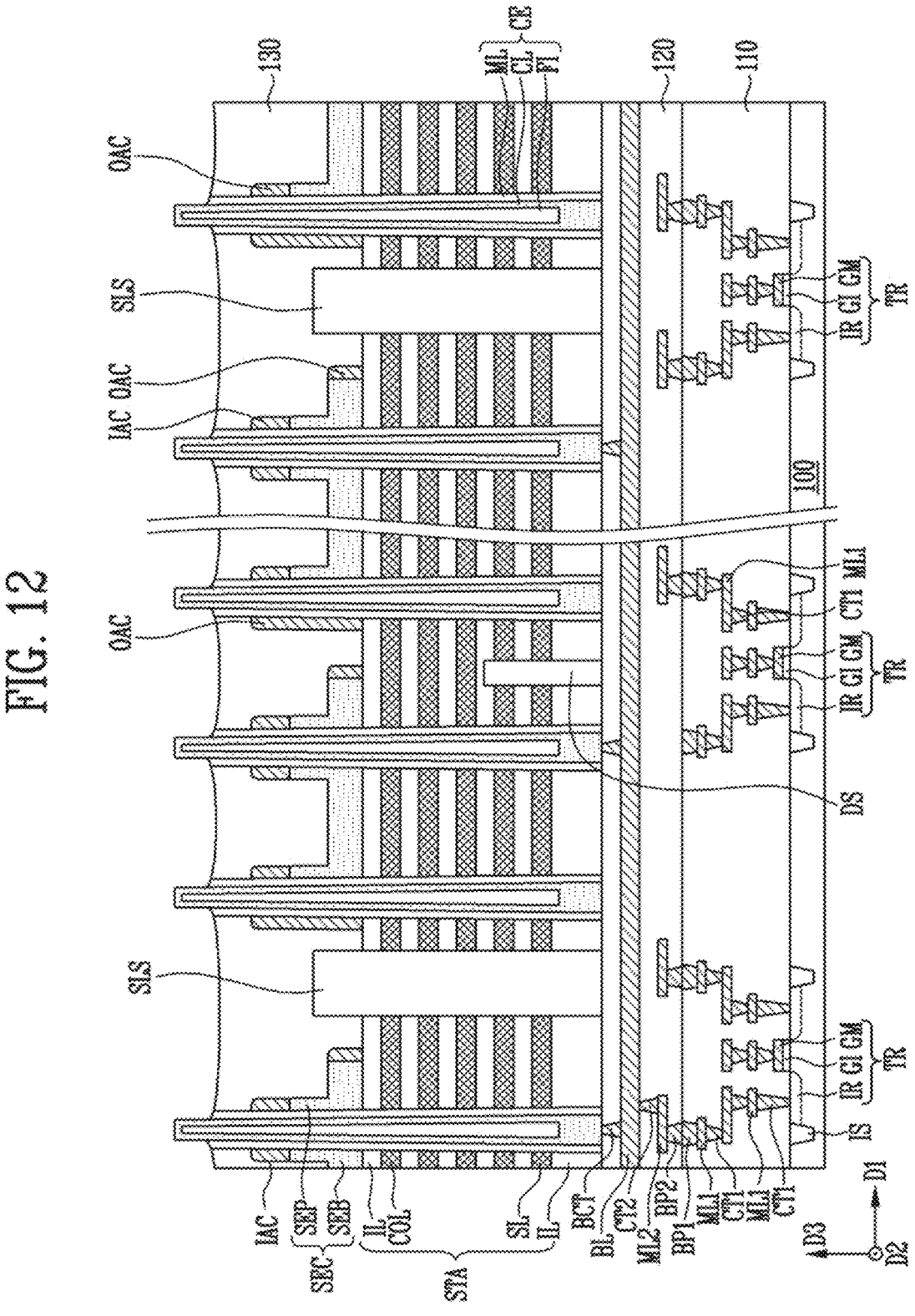

Referring to FIG. 12, an upper portion of the third insulating layer 130 may be removed. In an embodiment, the upper portion of the third insulating layer 130 may be removed through a chemical mechanical polishing (CMP) process and an etch-back process. The upper portion of the third insulating layer 130 may be removed to expose upper portions of the cell plugs CE.

Subsequently, the memory layers ML of each of the cell plugs CE may be etched. When the memory layer ML is etched, an upper portion of the memory layer ML may be removed. The memory layer ML may be etched to expose an upper portion of the channel layer CL.

Subsequently, as shown in FIG. 1B, a source layer SOL may be formed, which is connected to the channel layers CL. In an embodiment, the source layer SOL may be formed through a deposition process and a chemical mechanical polishing (CMP) process. Subsequently, a source barrier layer SOB may be formed on the source layer SOL as shown in FIG. 1B. In an embodiment, the source barrier layer SOB may be formed through a deposition process.

In accordance with the embodiment of the present disclosure, a length of each of the outer auxiliary conductors OAC and the inner auxiliary conductors IAC in the third direction D3 may be changed according to an etching amount of the auxiliary conductive layer AL. A length of each of the outer auxiliary conductors OAC and the inner auxiliary conductors IAC may fit a target by adjusting the etching amount of the auxiliary conductive layer AL. The etching amount of the auxiliary conductive layer AL may be controlled to fit a design target of off-characteristics of a select transistor.

In accordance with the embodiment of the present disclosure, a width of each of the openings OP of the mask layer MA shown in FIGS. 8A and 8B is not limited to no more than a distance between cell plugs CE adjacent to each other, and may be widely formed to overlap with some of the cell plugs CE. Thus, in accordance with the embodiment of the present disclosure, the openings OP of the mask layer MA used as a target may be formed even when high-resolution exposure equipment is not used.

As shown in FIG. 8B, sidewalls of some of the cell plugs CE may be exposed by the select conductors SEC defined by the openings OP of the mask layer MA shown in FIGS. 8A and 8B. In accordance with the embodiment of the present disclosure, as shown in FIG. 12, the outer auxiliary conductors OAC and the inner auxiliary conductors IAC may be formed on the sidewalls of the cell plugs CE, which are exposed by the select conductors SEC. The select line may be configured with the select conductor SEC, the outer auxiliary conductors OAC, and the inner auxiliary conductors IAC, which are connected to each other. In the embodiment of the present disclosure, a gate all around structure may be provided through the select line surrounding the sidewall of each of the cell plugs CE.

Figure 13A:
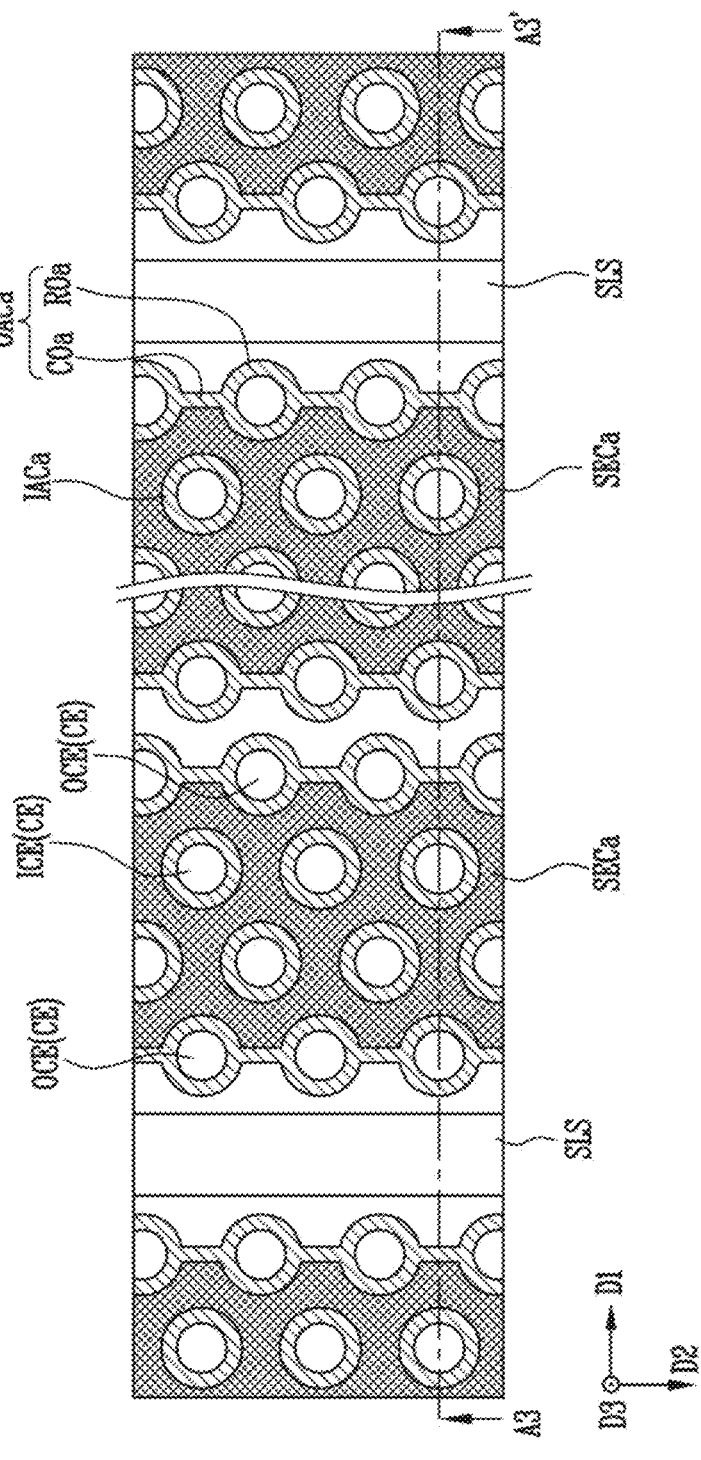
FIG. 13A is a plan view of a semiconductor device in accordance with an embodiment of the present disclosure.
Figure 13B:
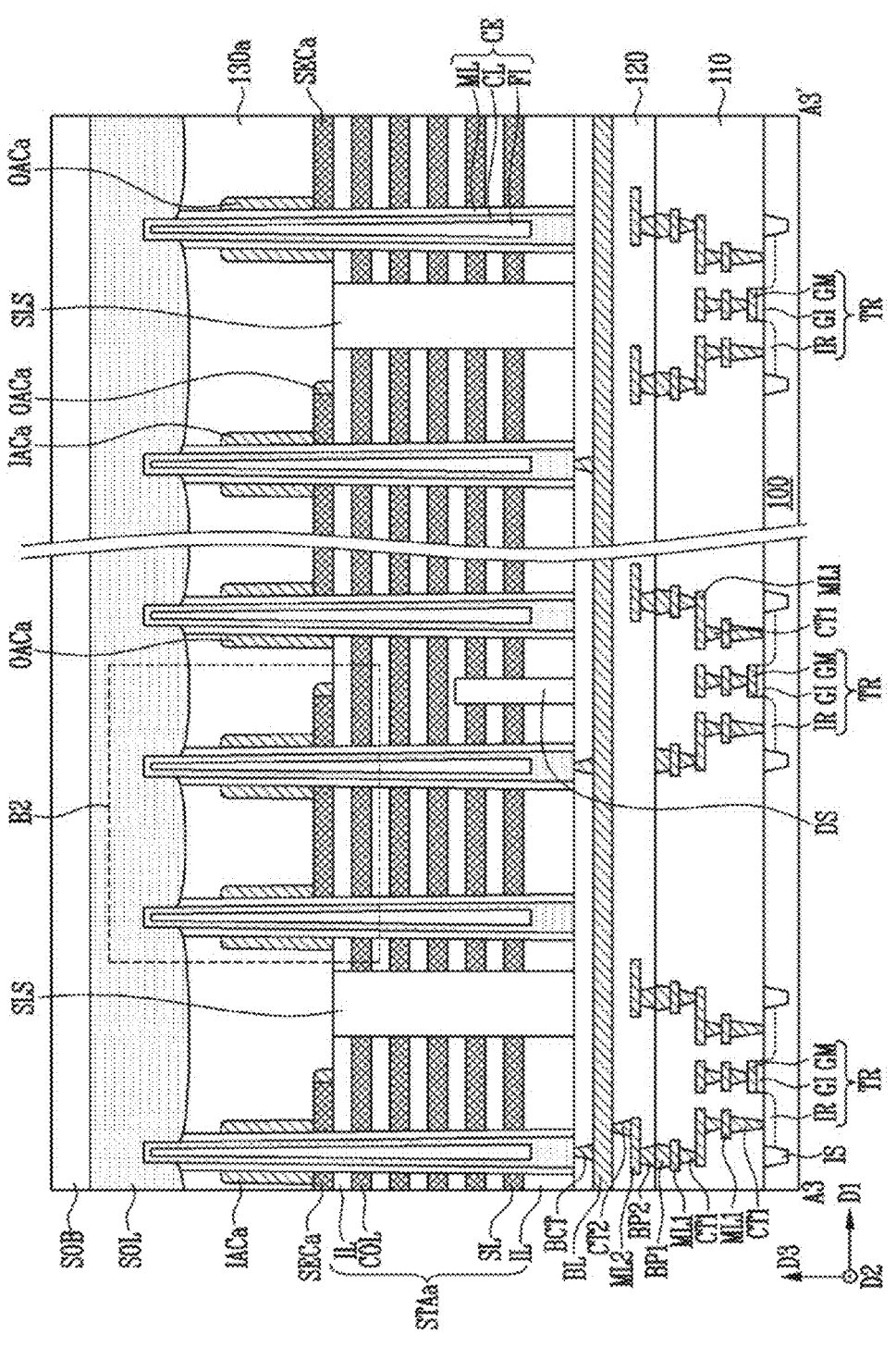
FIG. 13B is a sectional view of the semiconductor device taken along line A3-A3' shown in FIG. 13A.
Figure 13C:
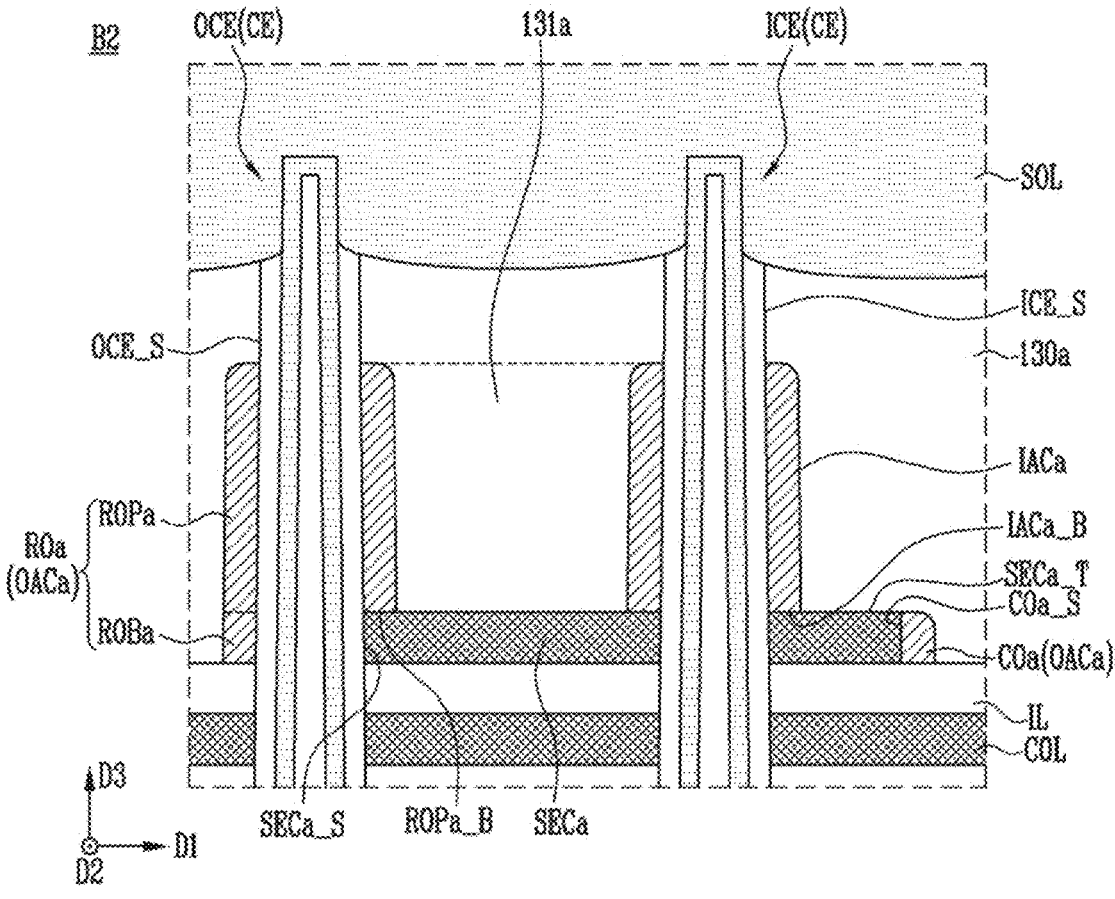
FIG. 13C is an enlarged view of a region B2 shown in FIG. 13B.
Figure 13D:
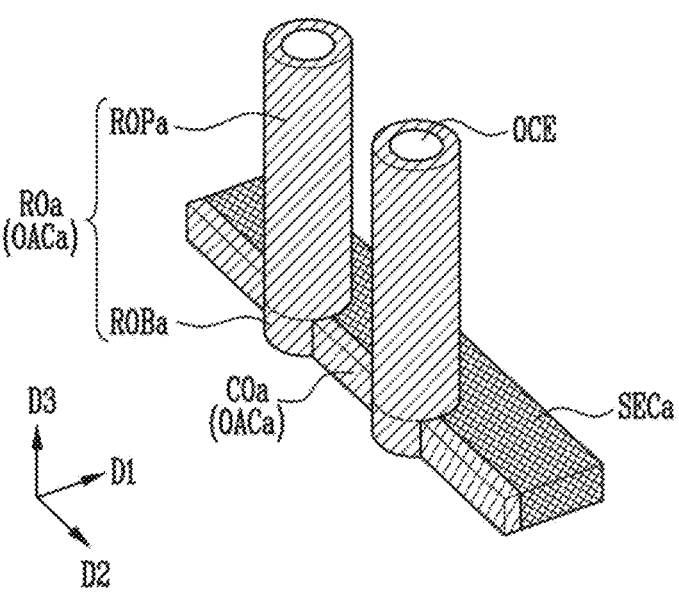
FIG. 13D is a perspective view illustrating an outer auxiliary conductor and an outer cell plug of the semiconductor device shown in FIGS. 13A, 13B, and 13C.
Figure 13E:
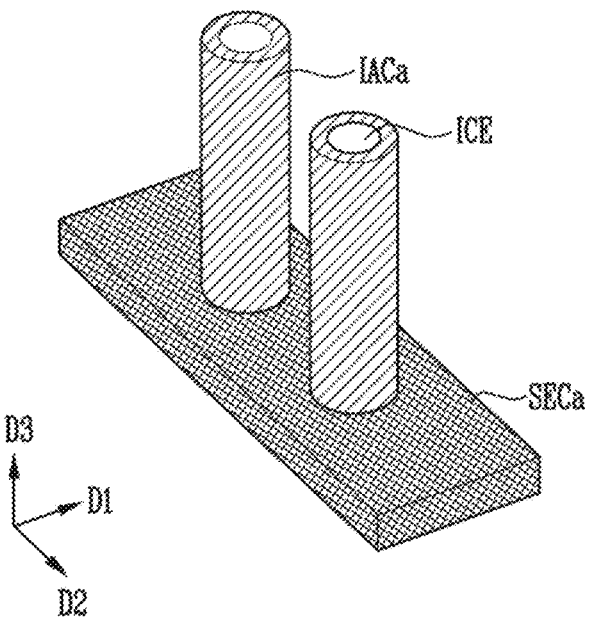
FIG. 13E is a perspective view illustrating an inner auxiliary conductor and an inner cell plug of the semiconductor device shown in FIGS. 13A, 13B, and 13C.

FIG. 13A is a plan view of a semiconductor device in accordance with an embodiment of the present disclosure. FIG. 13B is a sectional view of the semiconductor device taken along line A3-A3' shown in FIG. 13A. FIG. 13C is an enlarged view of a region B2 shown in FIG. 13B. FIG. 13D is a perspective view illustrating an outer auxiliary conductor and an outer cell plug of the semiconductor device shown in FIGS. 13A to 13C. FIG. 13E is a perspective view illustrating an inner auxiliary conductor and an inner cell plug of the semiconductor device shown in FIGS. 13A to 13C. Hereinafter, descriptions of portions overlapping with the descriptions described above will be omitted.

Referring to FIGS. 13A and 13B, the semiconductor device may include a stack structure STAa, select layers SL, interlayer insulating layers IL, and conductive layers COL. The stack structure STAa may be disposed on a first substrate 100.

Isolation layers IS and impurity regions IR of peripheral transistors TR may be formed in the first substrate 100. A first insulating layer 110, a gate insulating layer GI and a gate electrode GM of each of the peripheral transistors TR, first contacts CT1, first lines ML1, first bonding pads BP1, a second insulating layer 120, second bonding pads BP2, second lines ML2, a second contact CT2, a bit line, and a bit line contact BCT may be disposed between the first substrate 100 and the stack structure STAa.

Select conductors SECa may be disposed on the stack structure STAa. The select conductors SECa may be provided on the interlayer insulating layer IL. The select conductors SECa may be disposed at a level higher than that of the stack structure STAa. The select layers SL, the conductive layers COL, the interlayer insulating layers IL, and the select conductors SECa may overlap with each other in the third direction D3. The select conductors SECa may be disposed at a level higher than the levels of the conductive layers COL and the select layers SL. The select conductors SECa may surround cell plugs CE.

Each of the select conductors SECa may have a uniform thickness. The thickness of each of the select conductors SECa may be defined as the third direction D3. The thickness of each of the select conductors SECa may be equal to that of each of the conductive layer COL and the select layer SL. The select conductors SECa may include the same conductive material as the conductive layer COL and the select layer SL. In an embodiment, the select conductors SECa may include tungsten.

Outer auxiliary conductors OACa and inner auxiliary conductors IACa may be in contact with each of the select conductors SECa. The outer auxiliary conductors OACa may be disposed at both sides of the select conductor SECa. The select conductor SECa may be disposed between the outer auxiliary conductors OACa. The inner auxiliary conductors IACa may be disposed between the outer auxiliary conductors OACa.

The select conductor SECa, the outer auxiliary conductors OACa, and the inner auxiliary conductors IACa, which are connected to each other, may constitute a select line of the semiconductor device. In an embodiment, the select conductor SECa, the outer auxiliary conductors OACa, and the inner auxiliary conductors IACa, which are connected to each other, may be used as a source select line of the semiconductor device.

A third insulating layer 130a may cover the stack structure STAa, slit structures SLS, the select conductors SECa, the outer auxiliary conductors OACa, and the inner auxiliary conductors IACa.

Referring to FIGS. 13A, 13C, 13D, and 13E, the cell plugs CE may penetrate the select conductor SECa. Inner cell plugs ICE among the cell plugs CE may be surrounded by the select conductor SECa. Outer cell plugs OCE among the cell plugs CE may be disposed at both sides of the select conductor SECa. The outer cell plugs OCE may be in contact with a sidewall SECa_S of the select conductor SECa. The select conductor SECa may be in contact with a sidewall OCE_S of each of the outer cell plugs OCE and a sidewall ICE_S of each of the inner cell plugs ICE. The select conductor SECa may overlap with the outer auxiliary conductors OACa and the inner auxiliary conductors IACa.

Each of the outer auxiliary conductors OACa may include round parts ROa and connection parts COa. The round parts ROa and the connection parts COa of the outer auxiliary conductor OACa may be provided on the stack structure STAa. The round parts ROa and the connection parts COa of the outer auxiliary conductor OACa may be in contact with an interlayer insulating layer IL at an uppermost portion of the stack structure STAa. The round parts ROa may respectively surround the outer cell plugs OCE. Each of the round parts ROa may be in contact with the sidewall OCE_S of the outer cell plug OCE.

Each of the connection parts COa may connect adjacent round parts ROa to each other. The connection part COa may be connected to the select conductor SECa. A sidewall COa_S of the connection part COa may be in contact with the sidewall SECa_S of the select conductor SECa. The connection part COa may be disposed at the same level as the select conductor SECa. A maximum thickness of the connection part COa in the third direction D3 may be equal to that of the select conductor SECa in the third direction D3.

As shown in FIGS. 13C and 13D, the round part ROa may include a round base part ROBa and a round protrusion part ROPa. The round base part ROBa may be disposed at the same level as the connection part COa. The round base part ROBa may be connected to the connection part COa. The round base part ROBa may extend from the connection part COa. The round base part ROBa may be disposed at the same level as the select conductor SECa. The round base part ROBa may be connected to the select conductor SECa. A sidewall of the round base part ROBa may be in contact with the sidewall SECa_S of the select conductor SECa. The outer cell plug OCE may be disposed between the round base part ROBa and the select conductor SECa. The sidewall of the round base part ROBa may be in contact with the sidewall OCE_S of the outer cell plug OCE.

The round protrusion part ROPa may be disposed at a level higher than that of the round base part ROBa. The round protrusion part ROPa may be disposed at a level higher than that of the select conductor SECa. The round protrusion part ROPa may be disposed at a level higher than that of the connection part COa. The round protrusion part ROPs may surround the outer cell plug OCE. A sidewall of the round protrusion part ROPa may be in contact with the sidewall OCE_S of the outer cell plug OCE. The round protrusion part ROPa may extend in the third direction D3 from the round base part ROBa. The round protrusion part ROPa may extend to overlap with the select conductor SECa. A bottom surface ROPa_B of the round protrusion part ROPa may form a common surface with a top surface SECa_T of the select conductor SECa.

Referring to FIGS. 13C and 13E, the inner auxiliary conductor IACa may be provided on the select conductor SECa. A bottom surface IACa_B may form a common surface with the top surface SECa_T of the select conductor SECa. The inner auxiliary conductor IACa may surround the inner cell plug ICE. The inner auxiliary conductor IACa may be in contact with the sidewall ICE_S of the inner cell plug ICE. The inner auxiliary conductor IACa may be disposed at a level higher than that of the select conductor SECa. The inner auxiliary conductor IACa may be disposed at the same level as the round protrusion part ROPa of the outer auxiliary conductor OACa.

Referring to FIG. 13C, the third insulating layer 130a may include an interposition part 131a interposed between the outer auxiliary conductor OACa and the inner auxiliary conductor IACa. The interposition part 131a of the third insulating layer 130a may be interposed between the round protrusion part ROPa of the outer auxiliary conductor OACa and the inner auxiliary conductor IACa. The interposition part 131a of the third insulating layer 130a may be in contact with the round protrusion part ROPa of the outer auxiliary conductor OACa and the inner auxiliary conductor IACa. The interposition part 131a of the third insulating layer 130a may be in contact with the top surface SECa_T of the select conductor SECa.

FIGS. 14, 15, 16, 17, 18, and 19 are sectional views illustrating a manufacturing method of the semiconductor device in accordance with an embodiment of the present disclosure. Hereinafter, descriptions of portions overlapping with the descriptions described above will be omitted.

Figure 14:
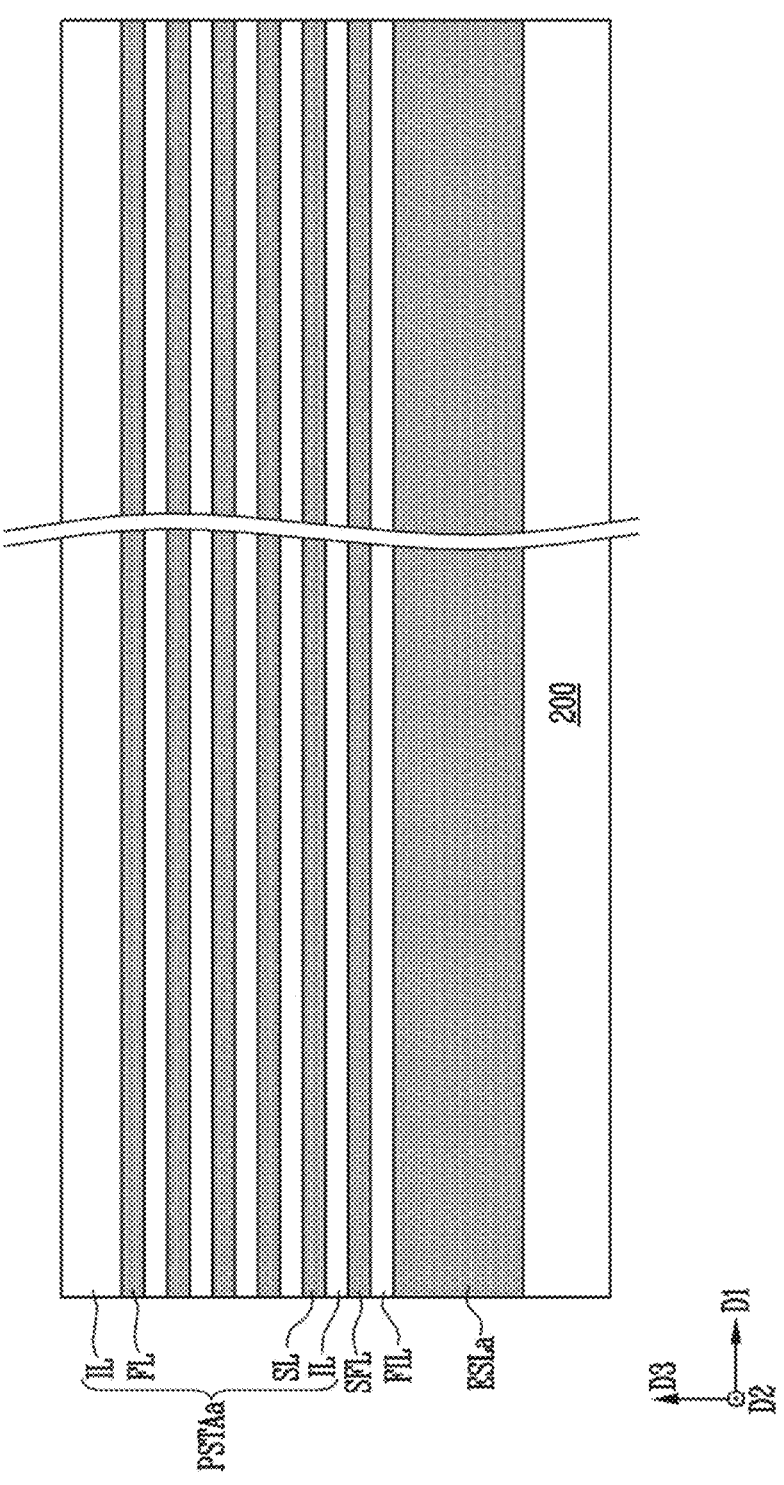

Referring to FIG. 14, an etch stop layer ESLa may be formed on a second substrate 200. An interlayer sacrificial layer FIL, a select sacrificial layer SFL, and a preliminary stack structure PSTAa may be sequentially formed on the etch stop layer ESLa. The interlayer sacrificial layer FIL may include oxide, or include a material having an etch selectivity with respect to the select sacrificial layer SFL and the preliminary stack structure PSTAa. In an embodiment, the material having the etch selectivity with respect to the select sacrificial layer SFL and the preliminary stack structure PSTAa may be silicon. The select sacrificial layer SFL may include an insulating material. In an embodiment, the select sacrificial layer SFL may include nitride.

Figure 15:
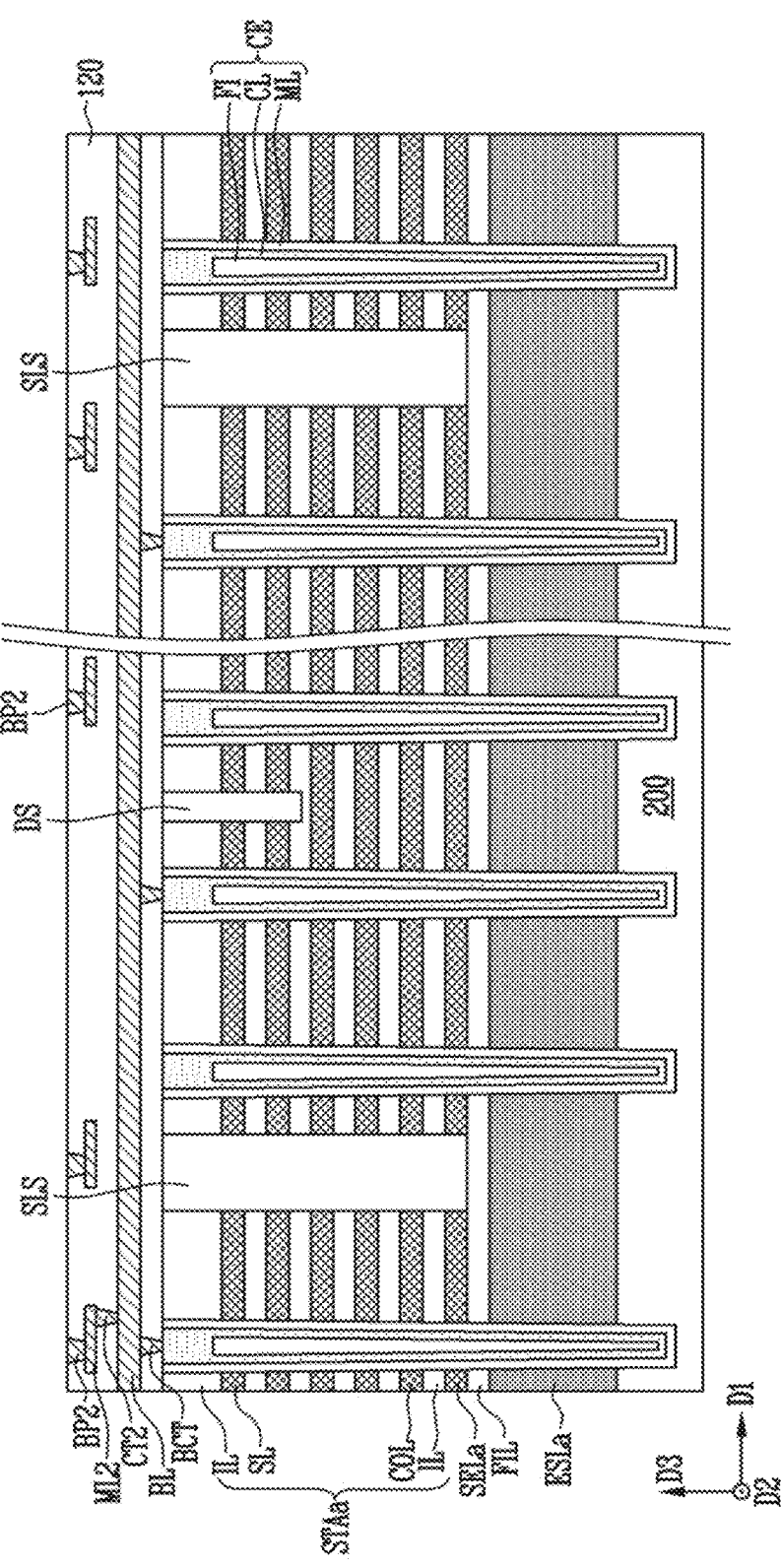

Referring to FIG. 15, cell plugs CE may be formed, which penetrate the preliminary stack structure PSTAa, the select sacrificial layer SFL, and the interlayer sacrificial layer FIL, which are shown in FIG. 14. An isolation structure DS may be formed in an upper portion of the preliminary stack structure PSTAa shown in FIG. 14.

Select layers SL, conductive layers COL, a select conductive layer SELa, and slit structures SLS may be formed. The forming of the select layers SL, the conductive layers COL, the select conductive layer SELa, and the slit structures SLS may include forming first slits penetrating stack sacrificial layers FI, interlayer insulating layers IL, and the select sacrificial layer SFL, which are shown in FIG. 14, removing the stack sacrificial layers FL and the select sacrificial layer SFL through the first slits, forming the select layers SL and the conductive layers COL in empty spaced formed by removing the stack sacrificial layers FL, forming the select conductive layer SELa in an empty space formed by removing the select sacrificial layer SFL, and forming the slit structures SLS in the first slits. Accordingly, a stack structure STAa may be defined, which include the select layers SL, the conductive layers COL, and the interlayer insulating layers IL. The select layers SL, the conductive layers COL, and the select conductive layer SELa may be formed of the same metal material. The interlayer sacrificial layer FIL may not be penetrated by the slit structure SLS.

A second insulating layer 120, a bit line contact BCT, a bit line BL, a second contact CT2, second lines ML2, and second bonding pads BP2 may be formed on the stack structure STAa.

Figure 16:
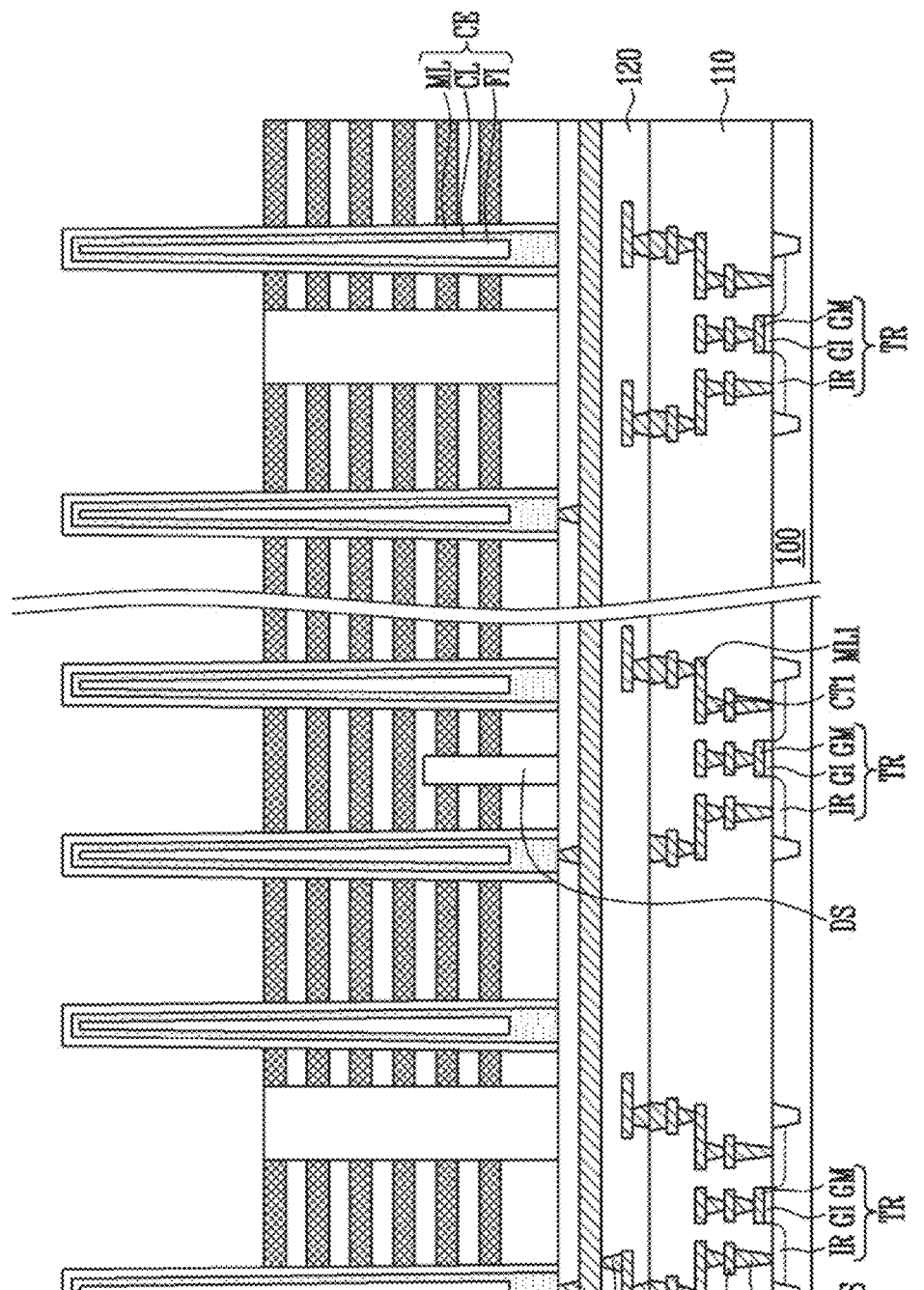

Referring to FIG. 16, the second substrate 200 shown in FIG. 15 may be aligned on a structure formed by using the processes described with reference to FIG. 2. For example, the second substrate 200 shown in FIG. 15 may be aligned on a first substrate 100 such that the second bonding pads BP2 face first bonding pads BP1. Impurity regions IR and a gate electrode GM of each of peripheral transistors TR may be connected to the second bonding pads BP2 via first contacts CT1, first lines ML1, and the first bonding pads BP1. The peripheral transistors TR may be electrically isolated from each other by isolation layers IS in the first substrate 100. A gate insulating layer GI and the gate electrode GM of each of the peripheral transistors TR, the first contacts CT1, the first lines ML1, and the first bonding pads BP1 may be buried in a first insulating layer 110. The first insulating layer 110 may cover the first substrate 100.

The second bonding pad BP2 may be bonded to the first bonding pad BP1, and the second insulating layer 120 may be bonded to the first insulating layer 110.

Subsequently, the second substrate 200, the etch stop layer ESLa, and the interlayer sacrificial layer FIL, which are shown in FIG. 15, may be sequentially removed. The interlayer sacrificial layer FIL is removed to expose a top surface of the select conductive layer SELa.

Figure 17:
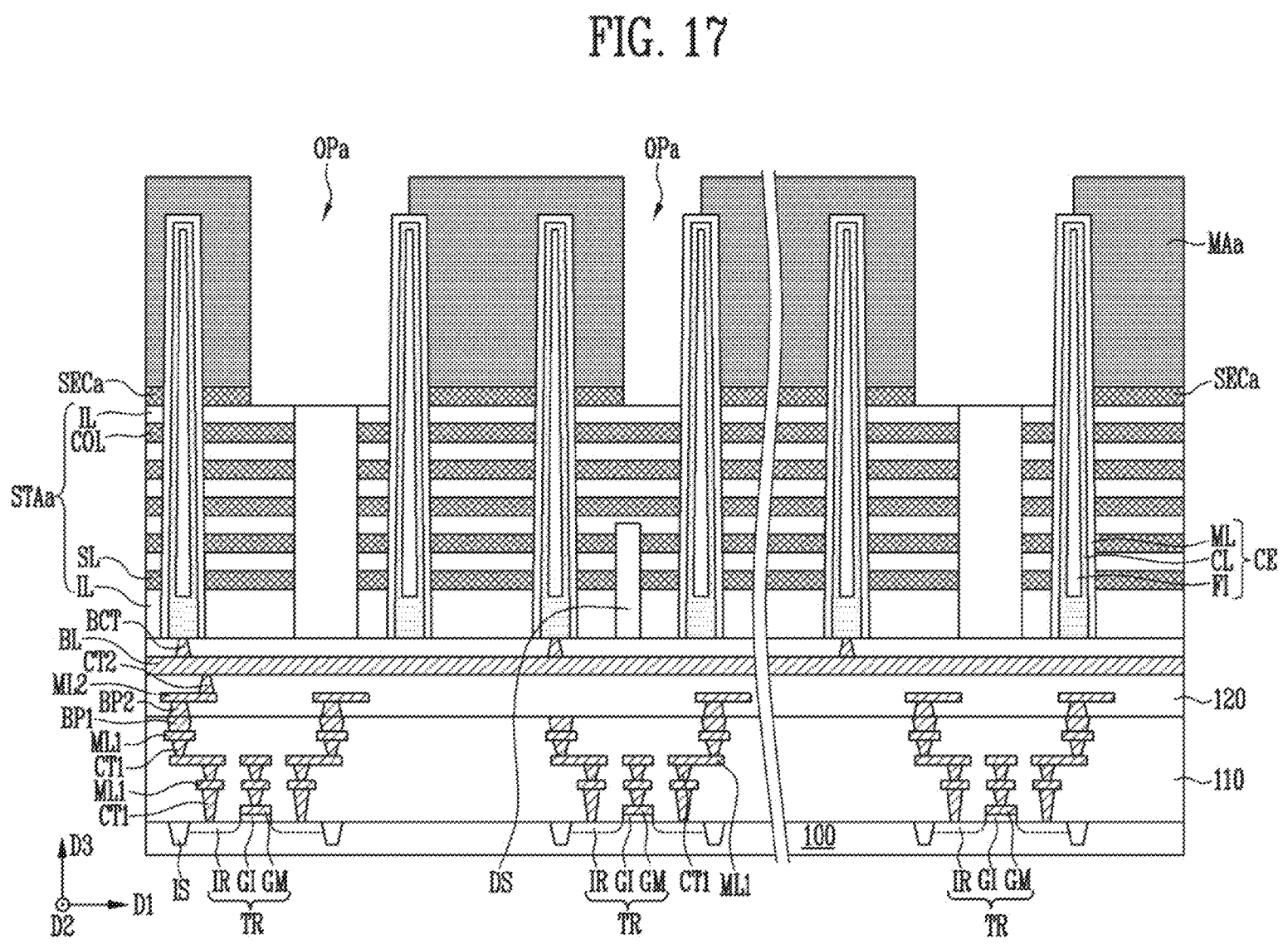

Referring to FIG. 17, a mask layer MAa may be formed on the cell plug CE and the select conductive layer SELa shown in FIG. 16. The mask layer MAa may include openings OPa.

The select conductive layer SELa shown in FIG. 16 may be etched by using the mask layer MAa as an etch barrier. As a result, select conductors SECa may be formed. Portions of the select conductive layer SELa, which are isolated from each other through etching, may be defined as the select conductors SECa. After the select conductive layer SELa is etched, the mask layer MAa may be removed.

Figure 18:
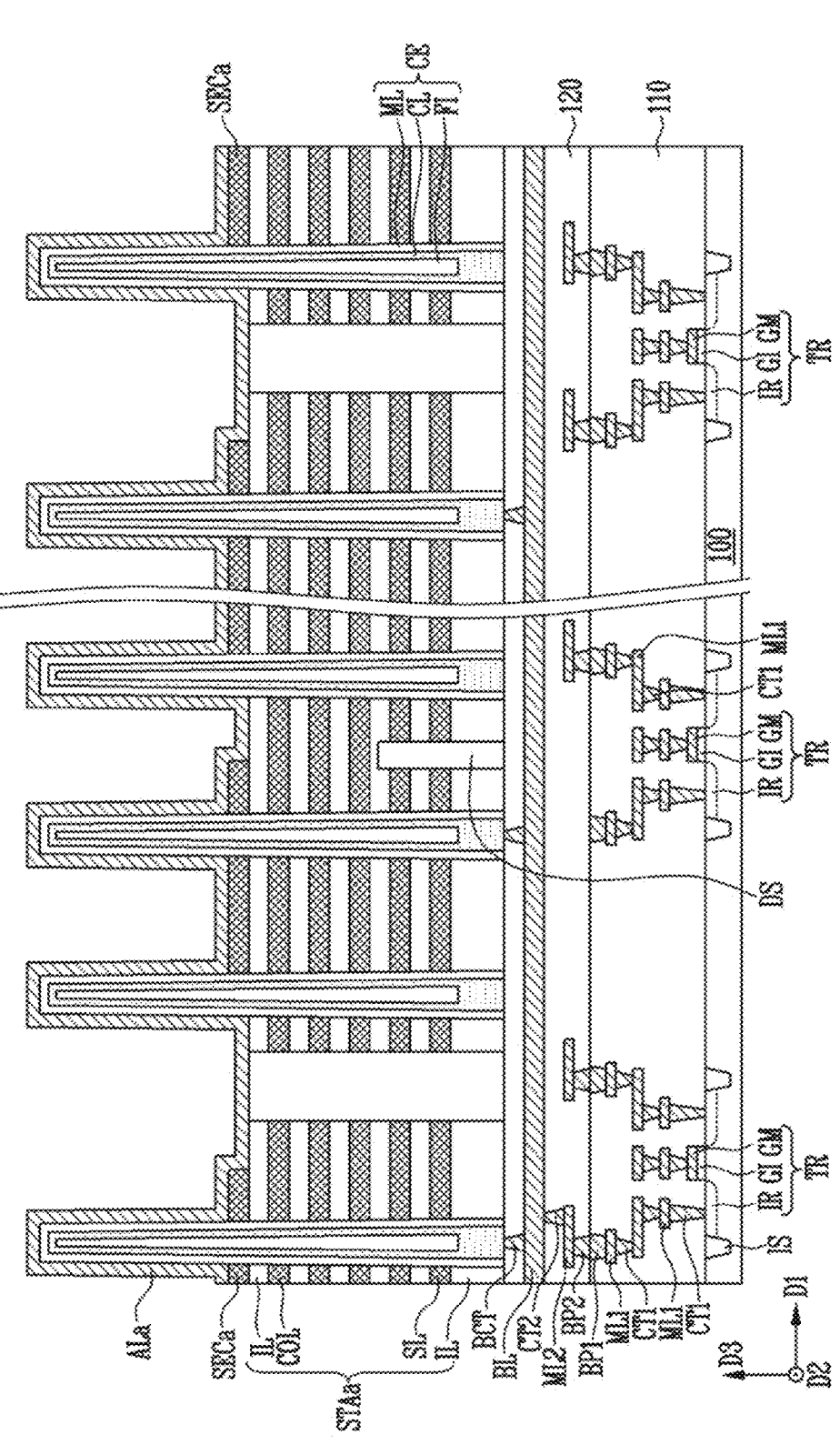

Referring to FIG. 18, an auxiliary conductive layer ALa may be formed. The auxiliary conductive layer ALa may conformally cover the cell plugs CE, the select conductors SECa, the slit structures SLS, and the stack structure STAa. The auxiliary conductive layer ALa may include a conductive material different from that of the select conductive layer SELa. In an example, the auxiliary conductive layer ALa may include titanium nitride.

Figure 19:
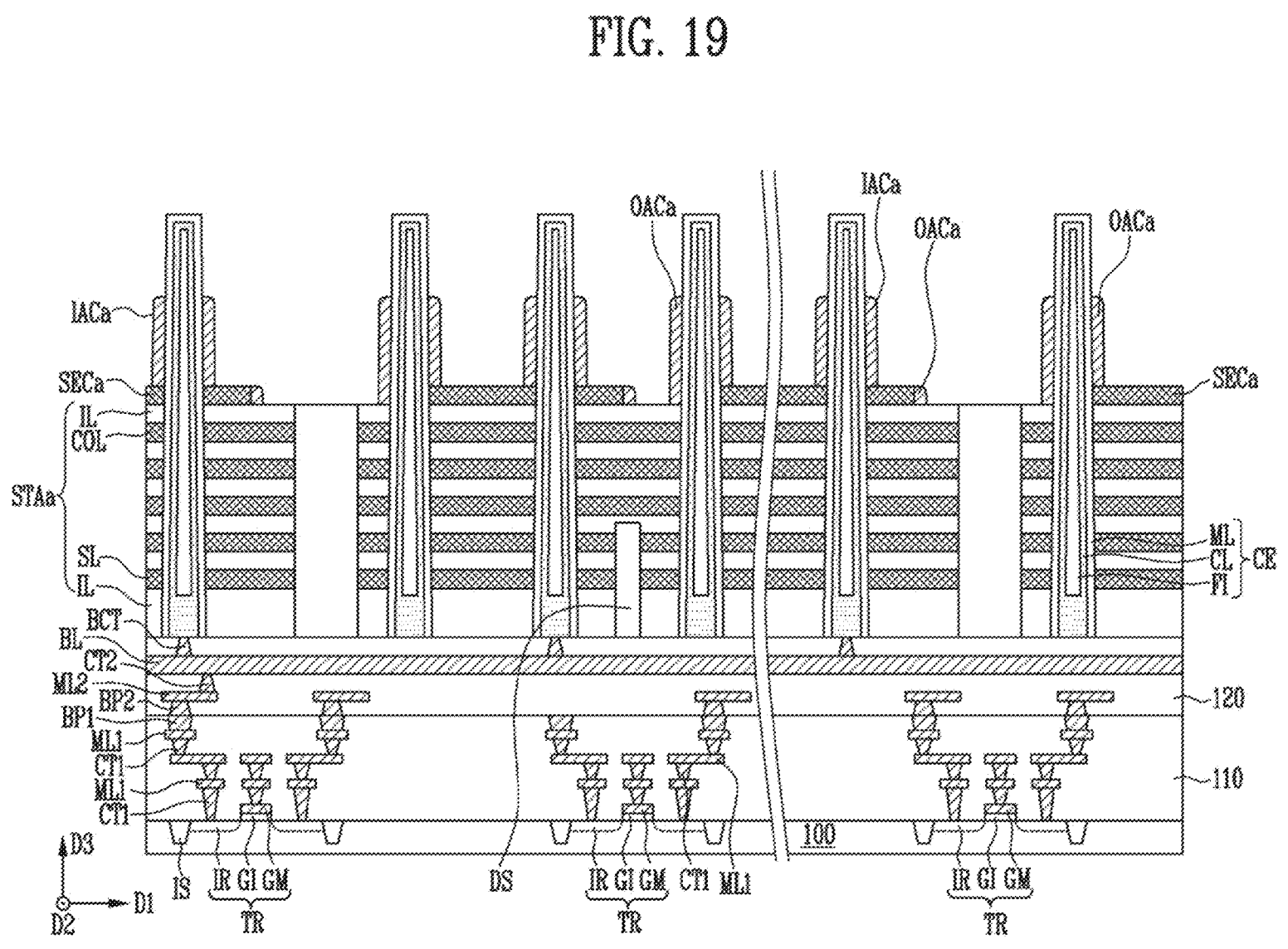

Referring to FIG. 19, the auxiliary conductive layer ALa shown in FIG. 18 may be etched. As a result, outer auxiliary conductors OACa and inner auxiliary conductors IACa may be formed.

Subsequently, the third insulating layer 130a, the source layer SOL, and the source barrier layer SOB, which are shown in FIG. 13B may be formed.

Figure 20A:
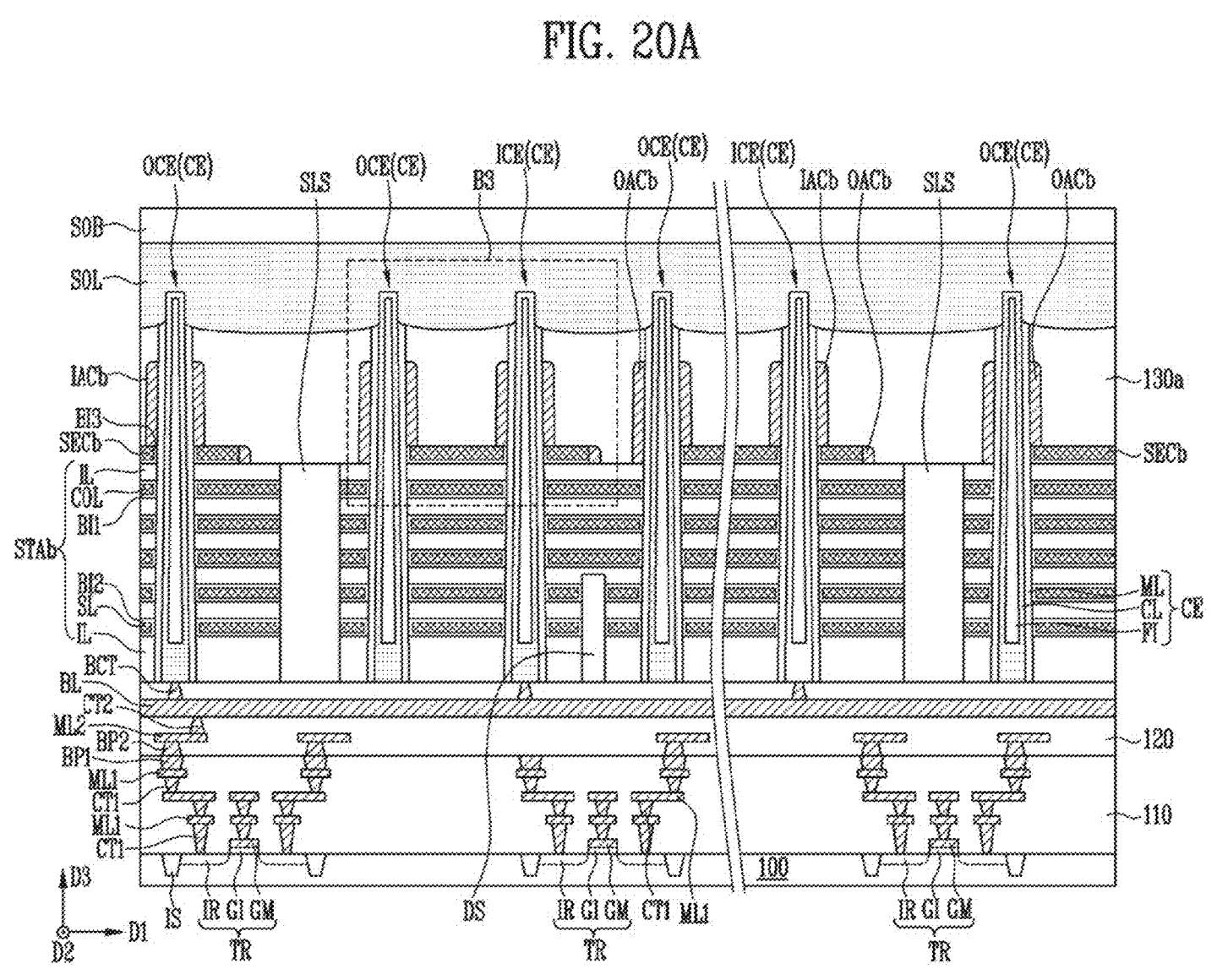
Figure 20B:
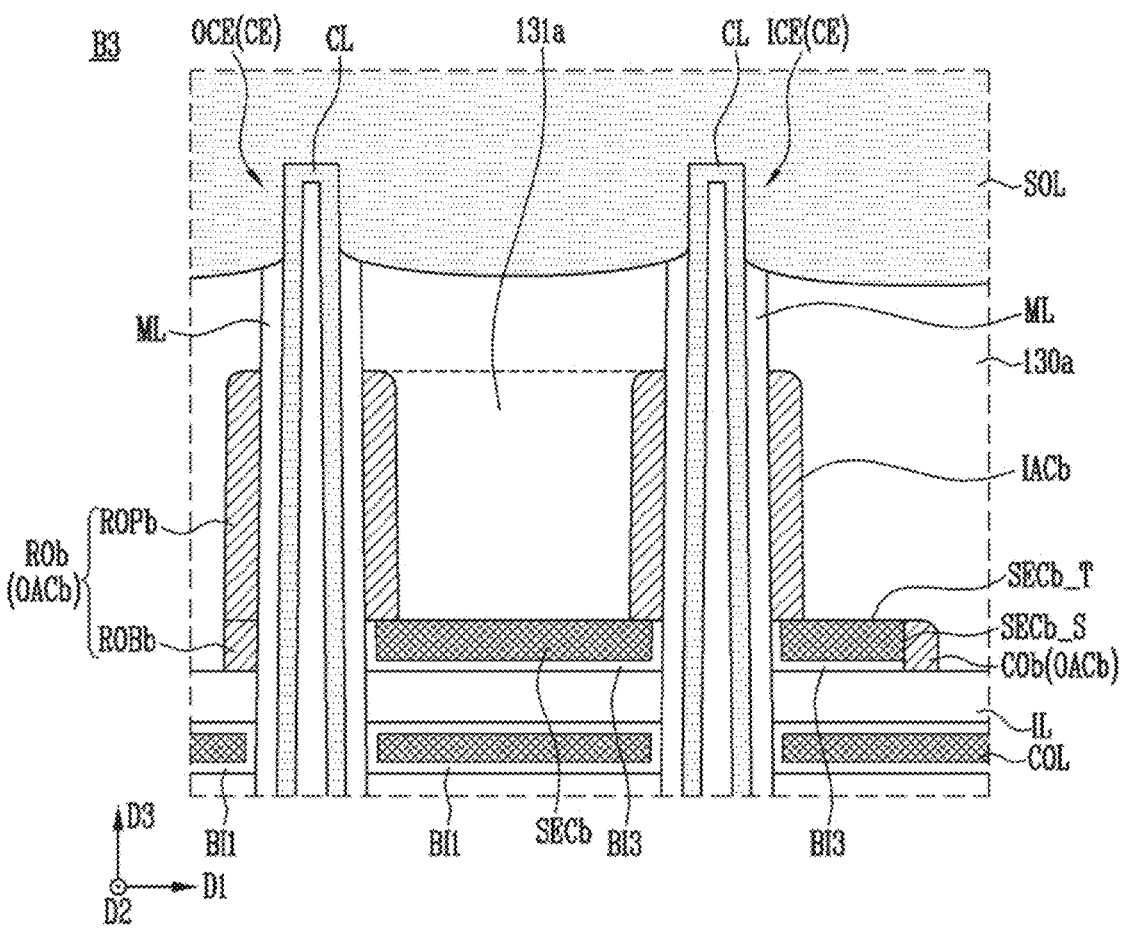

FIGS. 20A and 20B are sectional views illustrating a semiconductor device in accordance with an embodiment of the present disclosure. FIG. 20B is an enlarged view of region B3 shown in FIG. 20A. Hereinafter, descriptions of portions overlapping with the descriptions described above will be omitted.

Referring to FIG. 20A, a stack structure STAb may be disposed on a first substrate 100. Isolation layers IS and impurity regions IR of peripheral transistors TR may be formed in the substrate 100. A first insulating layer 110, a gate insulating layer GI and a gate electrode GM of each of the peripheral transistors TR, first contacts CT1, first lines ML1, first bonding pads BP1, a second insulating layer 120, second bonding pads BP2, second lines ML2, a second contact CT2, a bit line BL, and a bit line contact BCT may be disposed between the first substrate 100 and the stack structure STAb.

The stack structure STAb may include select layers SL, interlayer insulating layers IL, conductive layers COL, first blocking insulating layers BI1, and second blocking insulating layers BI2. Each of the select layers SL, the interlayer insulating layers IL, and the conductive layers COL may extend in the first direction D1 and the second direction D2.

Each of the interlayer insulating layers IL and the conductive layers COL may surround cell plugs CE. The cell plugs CE may include outer cell plugs OCE and inner cell plugs ICE. On a plane extending in the first direction D1 and the second direction D2, the outer cell plugs OCE and the inner cell plugs ICE may have the same arrangement as shown in FIG. 1A or 13A.

The interlayer insulating layers IL may be spaced apart from each other in the third direction D3. The select layers SL and the conductive layers COL may be respectively disposed in spaces between the interlayer insulating layers IL adjacent to each other in the third direction D3. The select layers SL of the stack structure STAb may be spaced apart from each other in the first direction D1 by an isolation structure DS. The select layers SL disposed at the same level may be electrically isolated from each other by the isolation structure DS.

The first blocking insulating layers BI1 may be respectively in contact with the conductive layers COL. The first blocking insulating layers BI1 may be disposed between the conductive layers COL and the cell plugs CE. The first blocking insulating layers BI1 may extend between the conductive layers COL and the interlayer insulating layers IL.

The second blocking insulating layers BI2 may be respectively in contact with the select layers SL. The second blocking insulating layers BI2 may be disposed between the select layers SL and the cell plugs CE. The second blocking insulating layers BI2 may extend between the select layers SL and the interlayer insulating layers IL. The second blocking insulating layers BI2 may extend between the select layers SL and the isolation structure DS.

Select conductors SECb may be disposed on the stack structure STAb. The select conductors SECb may surround the cell plugs CE at a level higher than the levels of the conductive layers COL and the select layers SL. The select conductors SECb may be respectively in contact with third blocking insulating layers BI3. The third blocking insulating layer BI3 may be disposed between the select conductors SECb and the cell plugs CE. The third blocking insulating layer 13 may extend between the select conductors SECb and an interlayer insulating layer IL disposed at an uppermost portion of the stack structure STAb.

Each of the cell plugs CE may include a filling layer FI, a channel layer CL, and a memory layer ML. The memory layer ML may include not only a data storage layer but also a tunnel insulating layer between the data storage layer and the channel layer CL and a fourth blocking insulating layer surrounding the data storage layer.

The first blocking insulating layers BI1, the second blocking insulating layers BI2, and the third blocking insulating layers BI3 may include the same insulating material. The first blocking insulating layers BI1, the second blocking insulating layers BI2, and the third blocking insulating layers BI3 may include an insulating material having a dielectric constant higher than that of the fourth blocking insulating layer of the memory layer ML. In an embodiment, each of the first blocking insulating layers BI1, the second blocking insulating layers BI2, and the third blocking insulating layers BI3 may include metal oxide such as aluminum oxide, and the fourth blocking insulating layer of the memory layer ML may include silicon oxide.

The select conductors SECb may include the same conductive material as the conductive layer COL and the select layer SL. In an embodiment, the select conductors SECb may include tungsten.

Outer auxiliary conductors OACb and inner auxiliary conductors IACb may be in contact with each of the select conductors SECb. The outer auxiliary conductors OACb may be disposed at both sides of the select conductor SECb. The select conductor SECb may be disposed between the outer auxiliary conductors OACb. The select conductor SECb, the outer auxiliary conductors OACb, and the inner auxiliary conductors IACb, which are connected to each other, may constitute a select line of the semiconductor device.

A third insulating layer 130a may cover the stack structure STAb, slit structures SLS, the select conductors SECb, the outer auxiliary conductors OACb, and the inner auxiliary conductors IACb. The third insulating layer 130a may be in contact with the select conductor SECb. A source layer SOL may be in contact with the channel layer CL of each of the cell plugs CE further protruding in the third direction D3 than the third insulating layer 130a. A source barrier layer SOB may be connected to the channel layer CL via the source layer SOL.

Referring to FIG. 20B, the outer auxiliary conductors OACb may be disposed at both sides of the select conductor SECb. Each outer auxiliary conductor OACb may include round parts ROb and connection parts COb. The round parts ROb and the connection parts COb of each outer auxiliary conductor OACb may be in contact with the interlayer insulating layer IL.

A three-dimensional structure of the round parts ROb and the connection parts COb of each outer auxiliary conductor OACb may be the same as that of the round parts ROa and the connection part COa, which are shown in FIG. 13D. For example, like the round parts ROa and the connection part COa, which are shown in FIG. 13D, each connection part COb may connect round parts ROb adjacent to each other in the second direction D2.

Each round part ROb may surround an outer cell plug OCE corresponding to the round part ROb. Each round part ROb may include a round base part ROBb and a round protrusion part ROPb. A three-dimensional structure of the round base part ROBb and the round protrusion part ROPb may be the same as that of the round base part ROBa and the round protrusion part ROPa, which are shown in FIG. 13D. For example, like the round base part ROBa and the round protrusion part ROPa, which are shown in FIG. 13D, the round base part ROBb and the round protrusion part ROPb may surround the outer cell plug OCE. The round base part ROBb may be disposed at the same level as the connection part COb. The round protrusion part ROPb may extend toward the source layer SOL from the round base part ROBb. The round protrusion part ROPb may overlap with the select conductor SECb.

The inner auxiliary conductors IACb may overlap with the select conductor SECb. A three-dimensional structure of the inner auxiliary conductors IACb may be the same as that of the auxiliary conductors IACa shown in FIG. 13E. For example, like the auxiliary conductors IACa shown in FIG. 13E, the inner auxiliary conductors IACb may respectively surround the inner cell plugs ICE.

The select conductor SECb may include a top surface SECb_T facing the source layer SOL. The select conductor SECb may include a sidewall SECb_S facing each of the connection part COb of the outer auxiliary conductors OACb. The top surface SECb_T and the sidewall SECb_S of the select conductor SECb are not covered by the third blocking insulating layer BI3, but may be opened. The top surface SECb_T of the select conductor SECb may be in contact with each of the round protrusion parts ROPb of each of the outer auxiliary conductors OACb and the inner auxiliary conductors IACb. The sidewall SECb_S of the select conductor SECb may be in contact with the connection parts COb of the outer auxiliary conductor OACb. Accordingly, the select conductor SECb, the outer auxiliary conductors OACb, and the inner auxiliary conductors IACb may be connected to each other.

The memory layer ML and the channel layer CL of each of the cell plugs CE may further protrude toward the source layer SOL than the outer auxiliary conductors OACb and the inner auxiliary conductors IACb. The channel layer CL of each of the cell plugs CE may further protrude toward the source layer SOL than the memory layer ML of each of the cell plug CE.

The insulating layer 130a may include an interposition part 131a interposed between the outer auxiliary conductor OACb and the inner auxiliary conductor IACb. The interposition part 131a of the third insulating layer 130a may in contact with the top surface SECb_T of the select conductor SECb. The third insulating layer 130a may surround the memory layer ML between the round part ROb of each of the outer auxiliary conductors OACb and the source layer SOL and the memory layer ML between the inner auxiliary conductors IACb and the source layer SOL.

The channel layer CL of each of the cell plugs CE may further protrude toward the source layer SOL than the third insulating layer 130a. The channel layer CL of each of the cell plugs CE may in contact with the source layer SOL.

FIGS. 21, 22, 23, and 24 are sectional views illustrating a manufacturing method of the semiconductor device in accordance with an embodiment of the present disclosure. Hereinafter, descriptions of portions overlapping with the descriptions described above will be omitted.

Figure 21:
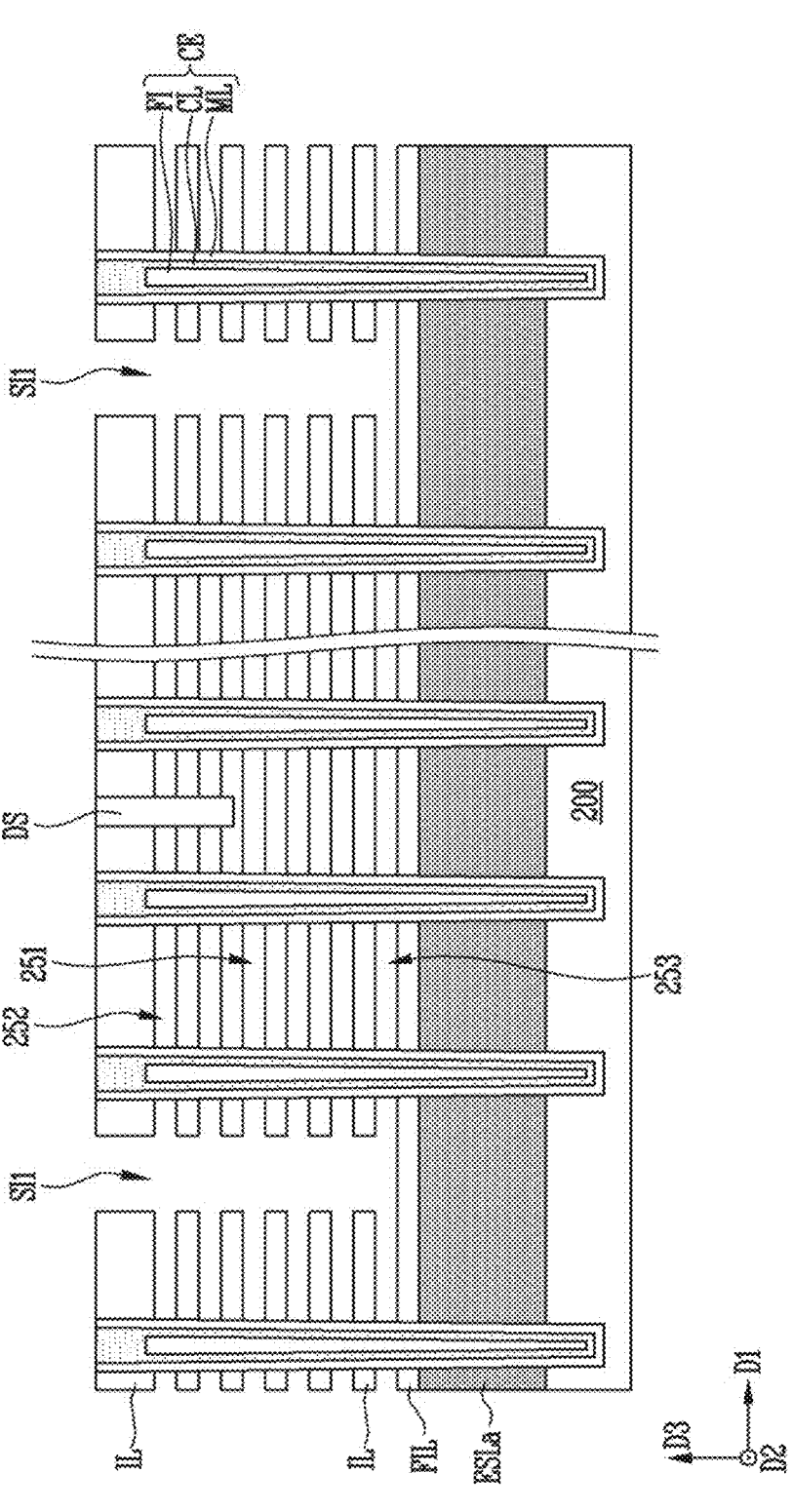

Before a process shown in FIG. 21 is performed, an etch stop layer ESLa, an interlayer sacrificial layer FIL, a select sacrificial layer SFL, and a preliminary stack structure PSTAb may be sequentially formed on the second substrate 200 as shown in FIG. 14.

Referring to FIG. 21, cell plugs CE may be formed to penetrate the preliminary stack structure PSTAa, the select sacrificial layer SFL, and the interlayer sacrificial layer FIL, which are shown in FIG. 14. An isolation structure DS may be formed in an upper portion of the preliminary stack structure PSTAa shown in FIG. 14. Each of the cell plugs CE may include a memory layer ML, a channel layer CL, and a filling layer FI.

Subsequently, first slits SI1 may be formed to penetrate not only the stack sacrificial layer FL and the interlayer insulating layers IL of the preliminary stack structure PSTAa shown in FIG. 14 but also the select sacrificial layer SFL. Subsequently, the stack sacrificial layers FL and the select sacrificial layer SFL, which are shown in FIG. 14, may be removed through the first slits SI1. Empty spaces 251, 252, and 253 may be defined in regions in which the stack sacrificial layers FL and the select sacrificial layer SFL are removed.

The spaces 251, 252, and 253 may include a first space 251, a second space 252, and a third space 253. The first space 251 may be defined in a region in which a stack sacrificial layer FL between the isolation structure DS and the etch stop layer ESLa among the stack sacrificial layers FL shown in FIG. 14 is removed. The second space 252 may be defined in a region in which a stack sacrificial layer FL in contact with the isolation structure DS among the stack sacrificial layers FL shown in FIG. 14 is removed. The third space 253 may be defined in a region in which the select sacrificial layer SFL shown in FIG. 14 is removed.

Figure 22:
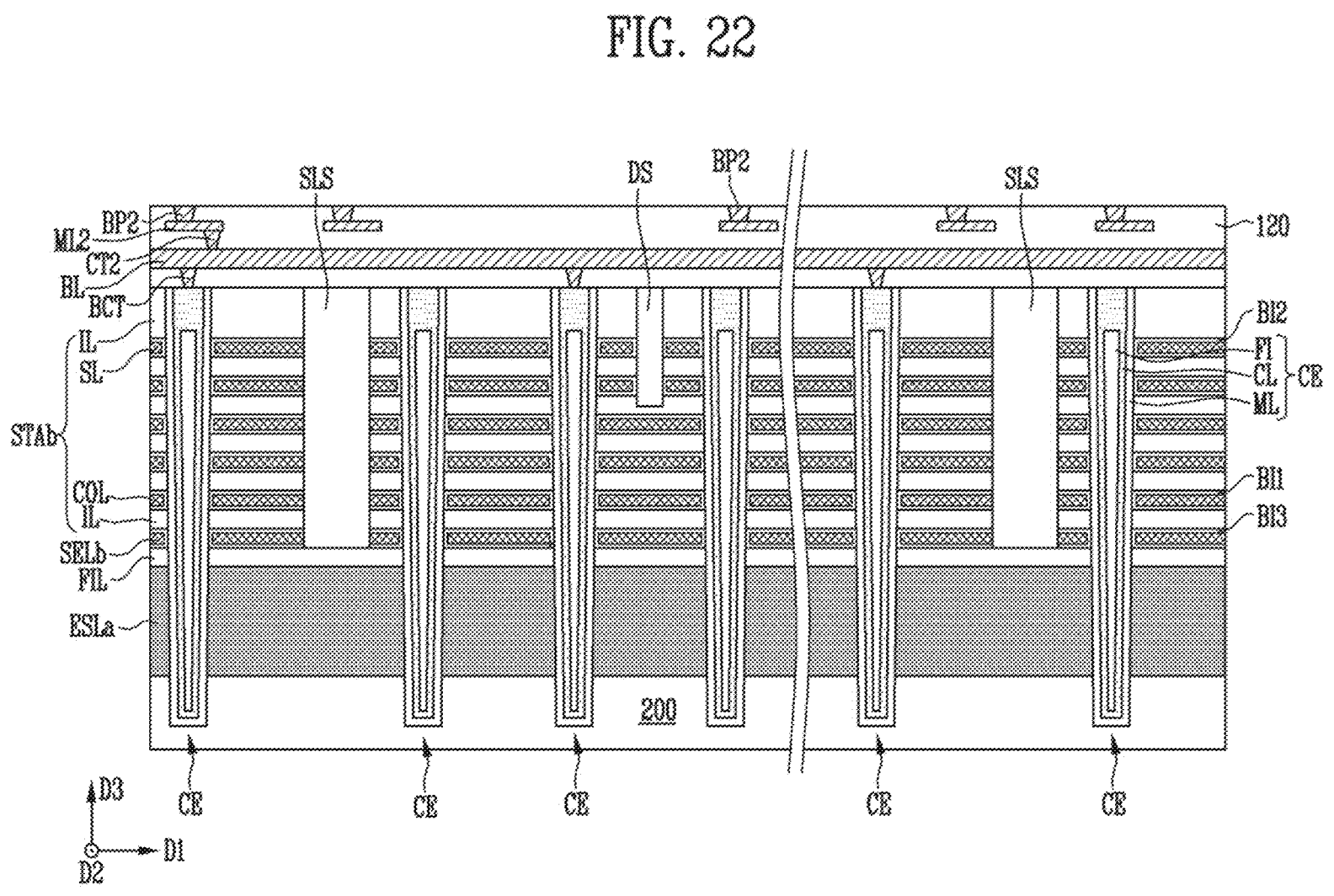

Referring to FIG. 22, blocking insulating layers BI1, BI2, and BI3 may be respectively formed on surfaces of the first space 251, the second space 252, and the third space 253, which are shown in FIG. 21. The blocking insulating layers BI1, BI2, and BI3 may surround a sidewall of each of the cell plugs CE. The blocking insulating layers BI1, BI2, and BI3 may include a first blocking insulating layer BI1, a second blocking insulating layer BI2, and a third blocking insulating layer BI3. The first blocking insulating layer BI1 may be disposed on the surface of the first space 251 shown in FIG. 21. The second blocking insulating layer BI2 may be disposed on the surface of the second space 252 shown in FIG. 21. The third blocking insulating layer BI3 may be disposed on the surface of the third space 253 shown in FIG. 21.

Subsequently, a select conductive layer SELb, a conductive layer COL, and a select layer SL may be formed. Accordingly, a stack structure STAb may be defined. The stack structure STAb may include the interlayer insulating layers IL, the first blocking insulating layer BI1, the second blocking insulating layer BI2, the conductive layer COL, and the select layer SL.

The select conductive layer SELb may fill a portion of the third space 253 shown in FIG. 21. The portion of the third space 253 may be defined as a region which is not filled with the third blocking insulating layer BI3. The conductive layer COL may fill a portion of the first space 251 shown in FIG. 21. The portion of the first space 251 may be defined as a region which is not filled with the first blocking insulating layer BI1. The select layer SL may fill a portion of the second space 252 shown in FIG. 21. The portion of the second space 252 may be defined as a region which is not filled with the second blocking insulating layer BI2.

After the stack structure STAb is formed, a slit structure SLS may be formed in the first slit SI1 shown in FIG. 21. Subsequently, a second insulating layer 120, a bit line contact BCT, a bit line BL, a second contact CT2, second lines ML2, and second bonding pads BP2 may be formed on the stack structure STAb.

Figure 23:
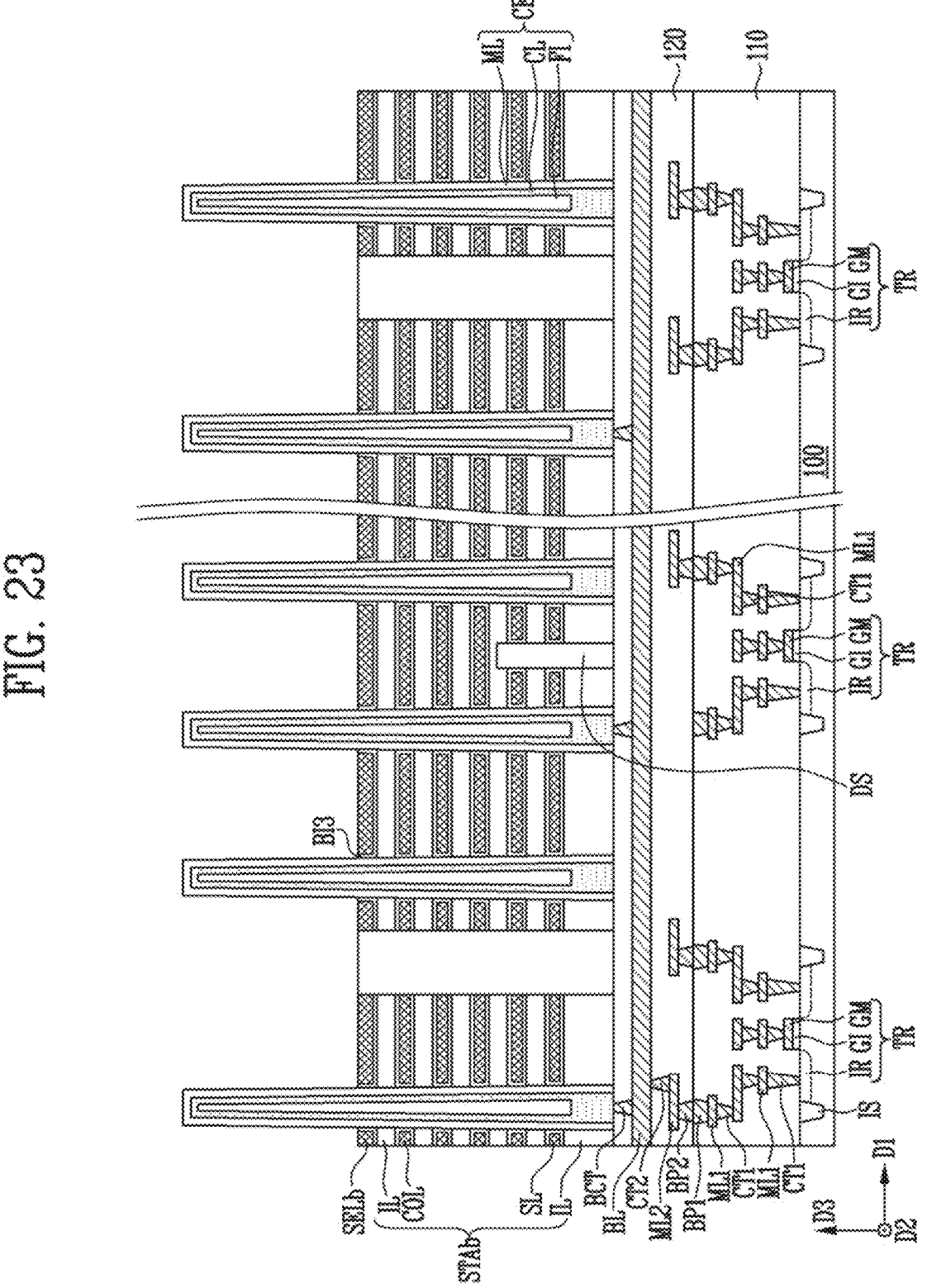

Referring to FIG. 23, a second substrate 200 shown in FIG. 22 may be aligned on a structure formed by using the processes described with reference to FIG. 2. For example, the substrate 200 shown in FIG. 22 may be aligned on a first substrate 100 such that the second bonding pads BP2 face first bonding pads BP1. Impurity regions IR and a gate electrode GM of each of peripheral transistors TR may be connected to the second bonding pads BP2 via first contacts CT1, first lines ML1, and the first bonding pads BP1. The peripheral transistors TR may be electrically isolated from each other by isolation layers IS in the first substrate 100. A gate insulating layer GI and the gate electrode of each of the peripheral transistors TR, the first contacts CT1, the first lines ML1, and the first bonding pads BP1 may be buried in a first insulating layer 110. The first insulating layer 110 may cover the first substrate 100.

The second bonding pad BP2 may be bonded to the first bonding pad BP1, and the second insulating layer 120 may be bonded to the first insulating layer 110.

Subsequently, the second substrate 200, the etch stop layer ESLa, and the interlayer sacrificial layer FIL, which are shown in FIG. 22, may be sequentially removed. The interlayer sacrificial layer FIL is removed to expose a portion of the third blocking insulating layer BI3. The exposed portion of the third blocking insulating layer BI3 is removed to expose a top surface of the select conductive layer SELb.

The third blocking insulating layer BI3 may remain between each of the cell plugs CE and the select conductive layer SELb. The third blocking insulating layer BI3 may remain between adjacent select conductive layers SELb and the interlayer insulating layer IL.

Figure 24:
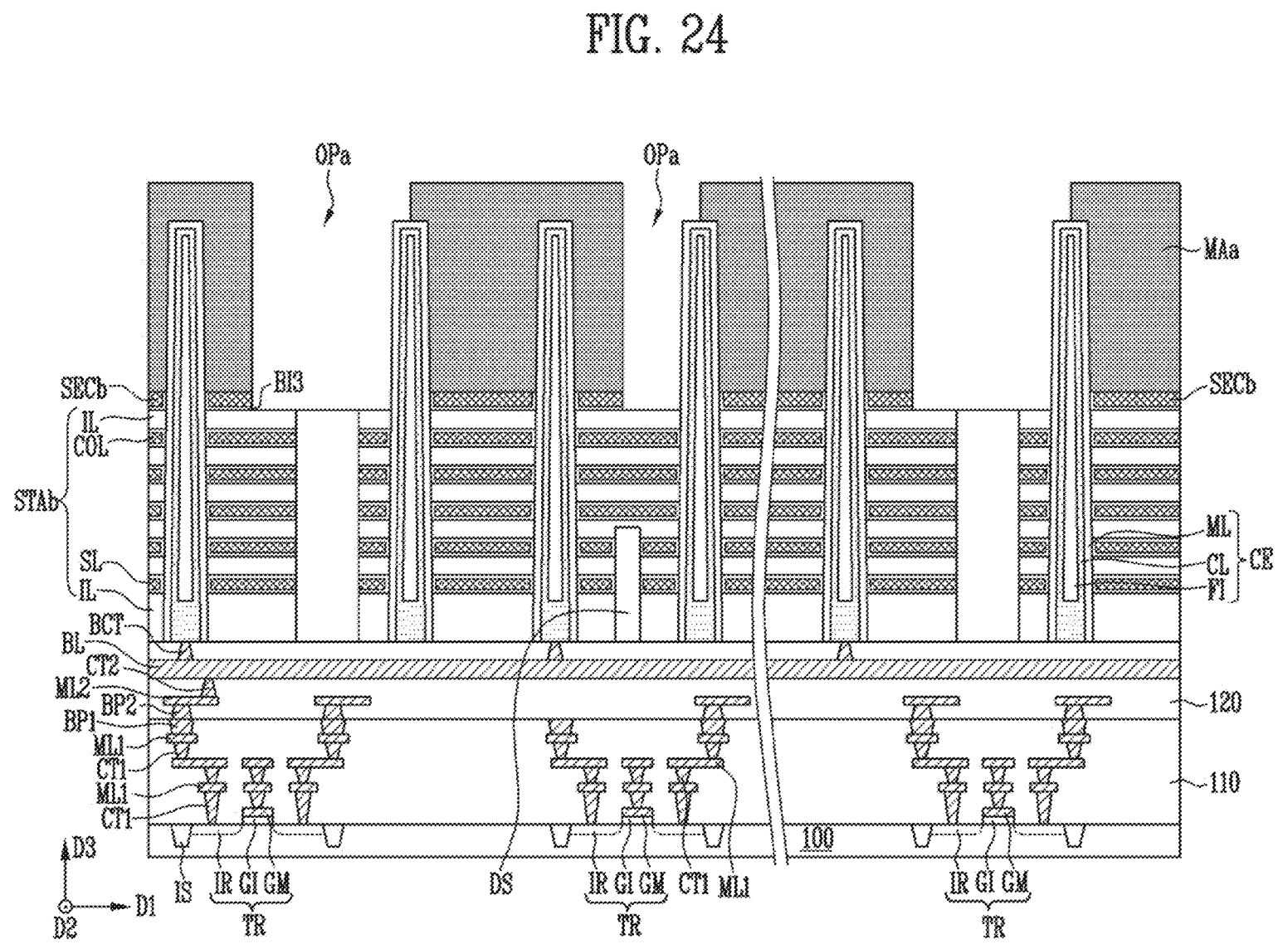

Referring to FIG. 24, a mask layer MAa may be formed on the cell plug CE and the select conductive layer SELb shown in FIG. 23. The mask layer MAa may include openings OPa.

The select conductive layer SELb and the third blocking insulating layer BI3, which are shown in FIG. 23, may be etched by using the mask layer MAa as an etch barrier. Accordingly, select conductors SECb isolated from each other may be defined, and a sidewall of each of the select conductors SECb may be exposed. After the select conductor SECb is formed, the mask layer MAa may be removed.

Subsequently, the processes described with reference to FIGS. 18 and 19 may be performed.

Figure 25:
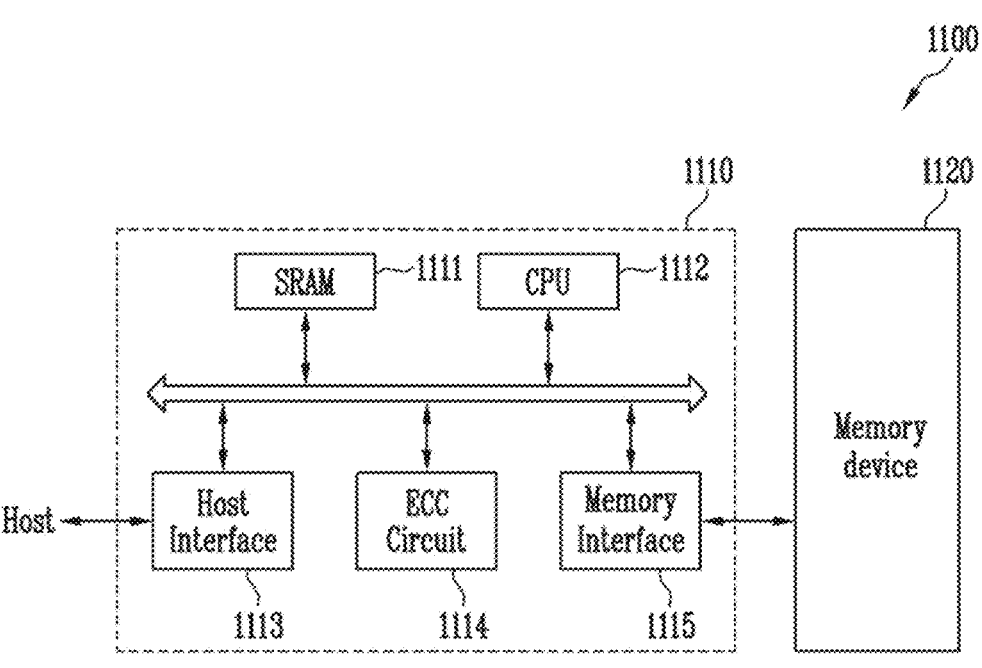
FIG. 25 is a block diagram illustrating a configuration of a memory system in accordance with an embodiment of the present disclosure.

FIG. 25 is a block diagram illustrating a configuration of a memory system in accordance with an embodiment of the present disclosure.

Referring to FIG. 25, the memory system 1100 includes a memory device 1120 and a memory controller 1110.

The memory device 1120 may include the semiconductor devices described above. The memory device 1120 may be a multi-chip package configured with a plurality of flash memory chips.

The memory controller 1110 is configured to control the memory device 1120, and may include Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include Read Only Memory (ROM) for storing code data for interfacing with the host, and the like.

The memory system 1100 configured as described above may be a memory card or a Solid State Drive (SSD), in which the memory device 1120 is combined with the memory controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 26:
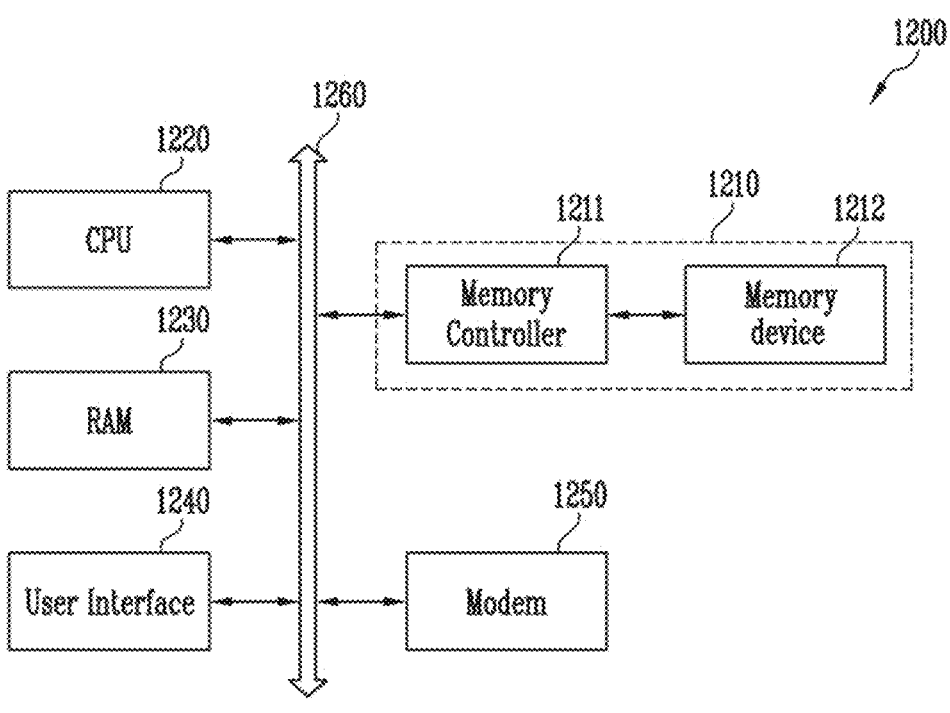
FIG. 26 is a block diagram illustrating a configuration of a computing system in accordance with an embodiment of the present disclosure.

FIG. 26 is a block diagram illustrating a configuration of a computing system in accordance with an embodiment of the present disclosure.

Referring to FIG. 26, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor, a mobile DRAM, and the like may be further included.

The memory system 1210 may be configured with a memory device 1212 and a memory controller 1211, which are similar to the memory device 1120 and the memory controller 1110 described with reference to FIG. 25.

In the semiconductor device in accordance with the present disclosure, a structure in which a select conductor and an auxiliary conductor are connected to each other is used as a select line, so that an RC delay of the select line may be reduced. Accordingly, the operational reliability of the semiconductor device may be improved.

What is claimed is:

1. A semiconductor device comprising:
conductive layers and interlayer insulating layers, which are alternately stacked;
a select conductor spaced apart from the conductive layers, the select conductor having a top surface facing a direction opposite to a direction facing the conductive layers and a bottom surface opposite to the top surface;
outer cell plugs penetrating the conductive layers, the interlayer insulating layers, and the select conductor;
an outer auxiliary conductor surrounding the outer cell plugs, the outer auxiliary conductor being in contact with the select conductor; and
an insulating layer covering the select conductor and the outer auxiliary conductor,
wherein the outer auxiliary conductor includes round parts and connection parts,
wherein the round parts respectively surround the outer cell plugs,
wherein the connection parts connect the round parts adjacent to each other,
wherein the outer auxiliary conductor has an opening exposing the top surface of the select conductor between the round parts,
wherein the select conductor includes outer select protrusion parts interposed between the round parts and a stack structure including the conductive layers and the interlayer insulating layers, and
wherein the insulating layer extends to be in contact with sidewalls of the outer select protrusion parts and the top surface of the select conductor.

2. The semiconductor device of claim 1, wherein the round parts respectively surround portions of the outer cell plugs, the portions of the outer cell plugs protruding beyond the select conductor.

3. The semiconductor device of claim 1, wherein each of the round parts include a round base part disposed at the same level as the connection parts and a round protrusion part disposed at a level higher than that of the connection parts.

4. The semiconductor device of claim 3, wherein the round protrusion part extends from the round base part.

5. The semiconductor device of claim 3, wherein the round protrusion part includes a first part disposed at the same level as the select conductor and a second part disposed at a level higher than that of the select conductor.

6. The semiconductor device of claim 3, wherein the round protrusion part overlaps with the select conductor.

7. The semiconductor device of claim 1, wherein the select conductor further includes a select base part disposed at the same level as the connection parts, and
wherein the outer select protrusion parts are disposed at a level higher than that of the connection parts.

8. The semiconductor device of claim 7, wherein the outer select protrusion parts are respectively in contact with the round parts.

9. The semiconductor device of claim 7, wherein a sidewall of each of the connection parts is in contact with a sidewall of the select base part.

10. The semiconductor device of claim 1,
wherein the outer auxiliary conductor includes a first conductive material and the select conductor includes a second conductive material, and
wherein the first conductive material is different from the second conductive material.

11. The semiconductor device of claim 10, wherein the outer auxiliary conductor includes titanium nitride.

12. The semiconductor device of claim 11, wherein the select conductor includes poly-silicon.

13. A semiconductor device comprising:
conductive layers and interlayer insulating layers, which are alternately stacked;
a select conductor spaced apart from the conductive layers, the select conductor having a top surface facing a direction opposite to a direction facing the conductive layers and a bottom surface opposite to the top surface;
inner cell plugs penetrating the conductive layers, the interlayer insulating layers, and the select conductor;
inner auxiliary conductors in contact with the select conductor, the inner auxiliary conductors being spaced apart from each other to expose the top surface of the select conductor between the inner auxiliary conductors; and
an insulating layer covering the select conductor and the inner auxiliary conductor,
wherein the inner auxiliary conductors respectively surround the inner cell plugs,
wherein the inner auxiliary conductors are disposed at a level higher than that of the select conductor,
wherein the select conductor includes inner select protrusion parts interposed between the inner auxiliary conductors and a stack structure including the conductive layers and the interlayer insulating layers, and
wherein the insulating layer extends to be in contact with sidewalls of the inner select protrusion parts and the top surface of the select conductor.

14. The semiconductor device of claim 13, wherein the select conductor further includes a select base part, and
wherein the inner select protrusion parts extends from the select base part.

15. The semiconductor device of claim 14, wherein a top surface of each of the inner select protrusion parts forms a common surface with a bottom surface of each of the inner auxiliary conductors.

16. The semiconductor device of claim 14, wherein the inner select protrusion parts respectively surround portions of the inner cell plugs protruding beyond the select base part.

17. The semiconductor device of claim 13, further comprising:

outer cell plugs penetrating the conductive layers, the interlayer insulating layers, and the select conductor; and an outer auxiliary conductor surrounding the outer cell plugs.

18. The semiconductor device of claim 17, wherein each of the inner auxiliary conductors and the outer auxiliary conductor include substantially the same material and the select conductor includes a material different from a material of each of the inner auxiliary conductors.

19. The semiconductor device of claim 13, wherein each of the inner auxiliary conductors includes a first conductive material and the select conductor includes a second conductive material, and wherein the first conductive material is different from the second conductive material.

20. The semiconductor device of claim 19, wherein each of the inner auxiliary conductor includes titanium nitride.

21. The semiconductor device of claim 20, wherein the select conductor includes poly-silicon.

\* \* \* \* \*